United States Patent
Peng et al.

(10) Patent No.: US 10,670,641 B2
(45) Date of Patent: Jun. 2, 2020

(54) SEMICONDUCTOR TEST DEVICE AND MANUFACTURING METHOD THEREOF

(71) Applicant: TAIWAN SEMICONDUCTOR MANUFACTURING CO., LTD., Hsinchu (TW)

(72) Inventors: Cheng-Yi Peng, Taipei (TW); Chia-Cheng Ho, Hsinchu (TW); Ming-Shiang Lin, Hsinchu (TW); Chih-Sheng Chang, Hsinchu (TW); Carlos H. Diaz, Los Altos Hills, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/683,317

(22) Filed: Aug. 22, 2017

(65) Prior Publication Data

US 2019/0064238 A1    Feb. 28, 2019

(51) Int. Cl.
*G01R 27/16* (2006.01)
*H01L 21/66* (2006.01)

(52) U.S. Cl.
CPC ............. *G01R 27/16* (2013.01); *H01L 22/34* (2013.01)

(58) Field of Classification Search
CPC ........ G01R 27/16; G01R 27/20; G01R 27/02; G01R 27/205; G01R 31/2623;
(Continued)

(56) References Cited

U.S. PATENT DOCUMENTS 4,896,108 A * 1/1990 Lynch .................... G01R 27/14
                                                324/713
8,497,171 B1   7/2013 Wu et al.
(Continued)

FOREIGN PATENT DOCUMENTS

CN     106558509 A    4/2017
CN     106571312 A    4/2017
(Continued)

OTHER PUBLICATIONS

Tech Design Forum, FinFETS: What is a FinFET and why is it useful?, www.techdesignforums.com/practice/guides/finfets/, Jun. 2013. (Year: 2013).*

*Primary Examiner* — Patrick Assouad
*Assistant Examiner* — Sean Curtis
(74) *Attorney, Agent, or Firm* — McDermott Will & Emery LLP

(57) ABSTRACT

A semiconductor test device for measuring a contact resistance includes: first fin structures, upper portions of the first fin structures protruding from an isolation insulating layer; epitaxial layers formed on the upper portions of the first fin structures, respectively; first conductive layers formed on the epitaxial layers, respectively; a first contact layer disposed on the first conductive layers at a first point; a second contact layer disposed on the first conductive layers at a second point apart from the first point; a first pad coupled to the first contact layer via a first wiring; and a second pad coupled to the second contact layer via a second wiring. The semiconductor test device is configured to measure the contact resistance between the first contact layer and the first fin structures by applying a current between the first pad and the second pad.

19 Claims, 36 Drawing Sheets

(58) Field of Classification Search
CPC ........... H01L 27/10826; H01L 27/0883; H01L 27/0886; H01L 27/10879; H01L 27/1211; H01L 29/785; H01L 29/788; H01L 29/1095; H01L 29/66795; H01L 22/32
USPC ........ 324/421, 691; 257/288, 347, 742, 743, 257/744, 745, 758, E29.121, E29.139, 257/E29.144; 438/17, 157, 213, 218, 438/219, 199, 269
See application file for complete search history.

(56) References Cited

U.S. PATENT DOCUMENTS

| | | | |
|---|---|---|---|
| 9,093,335 B2 * | 7/2015 | Wann | H01L 22/14 |
| 9,318,581 B1 * | 4/2016 | Guo | H01L 29/7853 |
| 10,354,930 B2 * | 7/2019 | Liu | H01L 22/34 |
| 2008/0297180 A1 * | 12/2008 | Vinet | H01L 22/34 |
| | | | 324/719 |
| 2012/0242356 A1 * | 9/2012 | Ohuchi | H01L 22/34 |
| | | | 324/705 |
| 2014/0124842 A1 | 5/2014 | Wang et al. | |
| 2016/0187414 A1 * | 6/2016 | Lin | H01L 27/0886 |
| | | | 324/719 |
| 2016/0268174 A1 * | 9/2016 | Wann | H01L 22/14 |
| 2017/0307667 A1 * | 10/2017 | Liu | H01L 22/34 |
| 2018/0190551 A1 * | 7/2018 | Li | H01L 22/34 |
| 2019/0064238 A1 * | 2/2019 | Peng | G01R 27/16 |

FOREIGN PATENT DOCUMENTS

| | | |
|---|---|---|
| TW | 201633531 A | 9/2016 |
| TW | 201640681 A | 11/2016 |
| TW | 201715615 A | 5/2017 |

\* cited by examiner

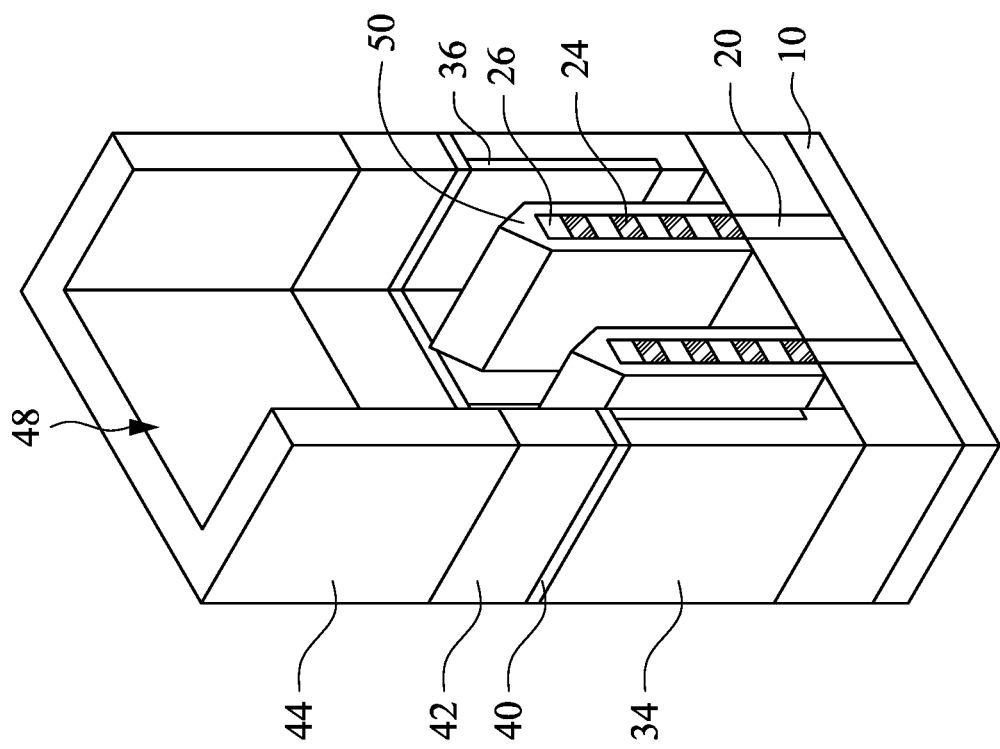
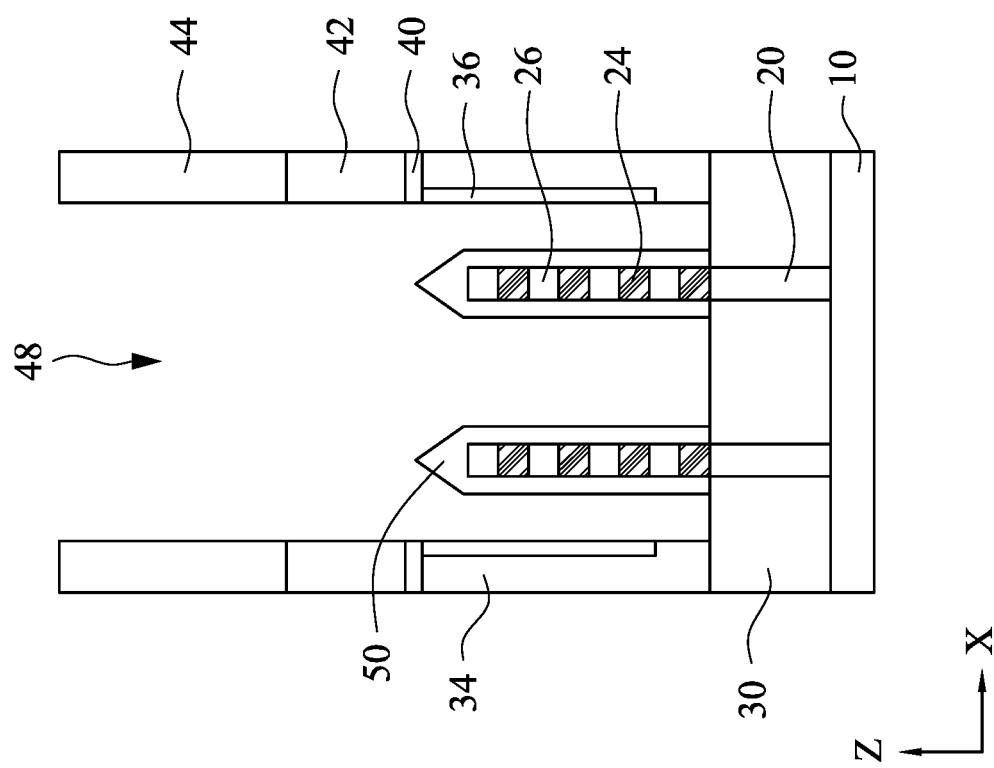
FIG. 13C
FIG. 13B

SEMICONDUCTOR TEST DEVICE AND MANUFACTURING METHOD THEREOF

TECHNICAL FIELD

The disclosure relates to semiconductor test devices for measuring a contact resistance, methods of manufacturing the semiconductor test devices and contact resistance measurement methods using the semiconductor test devices.

BACKGROUND

As the semiconductor industry has progressed into nanometer technology process nodes in pursuit of higher device density, lowering a contact resistance between a source/drain epitaxial layer and a conductive contact layer including a silicide layer has become one of the important issues. Thus, semiconductor test devices (structures) which can more precisely measure contact resistance have been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a perspective view and FIG. 1B is a cross sectional view of a semiconductor test device according to an embodiment of the present disclosure. FIGS. 1C and 1D show cross sectional views of semiconductor test devices according to other embodiments of the present disclosure.

FIG. 13B shows a cross sectional view and FIG. 13C is a cut view of one of the various stages of manufacturing a semiconductor test device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." The term "at least one of A and B" means "A", "B" or "A and B" and does not mean "one from A and one from B" unless otherwise explained.

In the present disclosure, a semiconductor test device for measuring a contact resistance between a source/drain epitaxial layer of a field effect transistor (FET) and a conductive contact layer including a silicide layer is explained. The semiconductor test structure is fabricated with FETs on the same substrate (wafer) during the fabrication of the FETs. In this disclosure, a source/drain refers to a source and/or a drain. Further, the FET of the present disclosure includes a planar FET, a fin FET (FinFET) and/or a gate-all-around FET (GAA FET).

The contact layer to the source/drain epitaxial layer is one of the key structures of the advanced FETs. If the contact area between the contact layer and the source/drain epitaxial layer is small, a contact resistance between the contact layer and the source/drain epitaxial layer increases. In particular, when the sides the source/drain epitaxial layer are not fully in contact with the contact layer, sufficiently low contact resistance cannot be obtained.

Figure 1A:
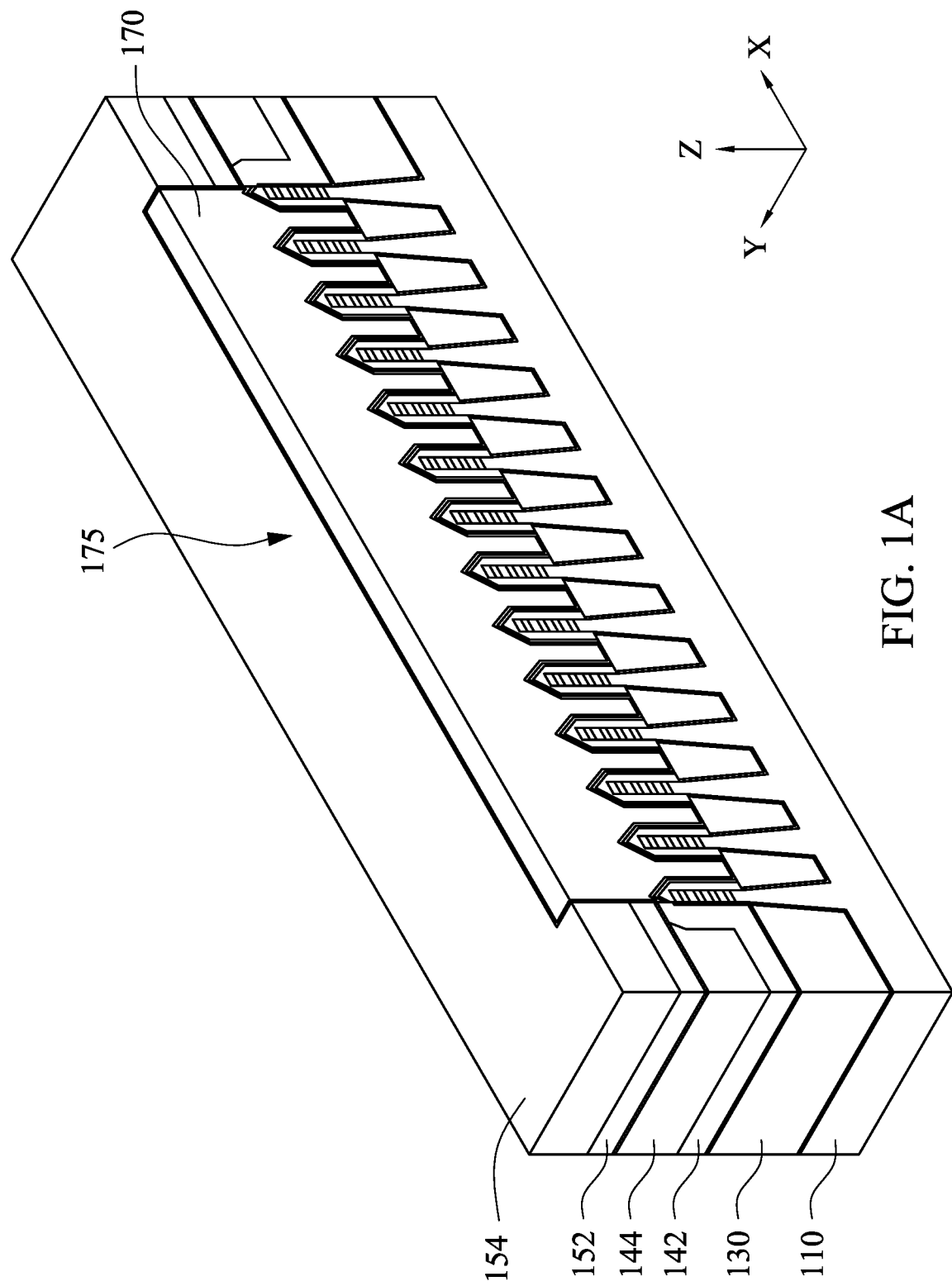
FIGS. 1A-1D show various views of a semiconductor test device according to an embodiment of the present disclosure.
Figure 1B:
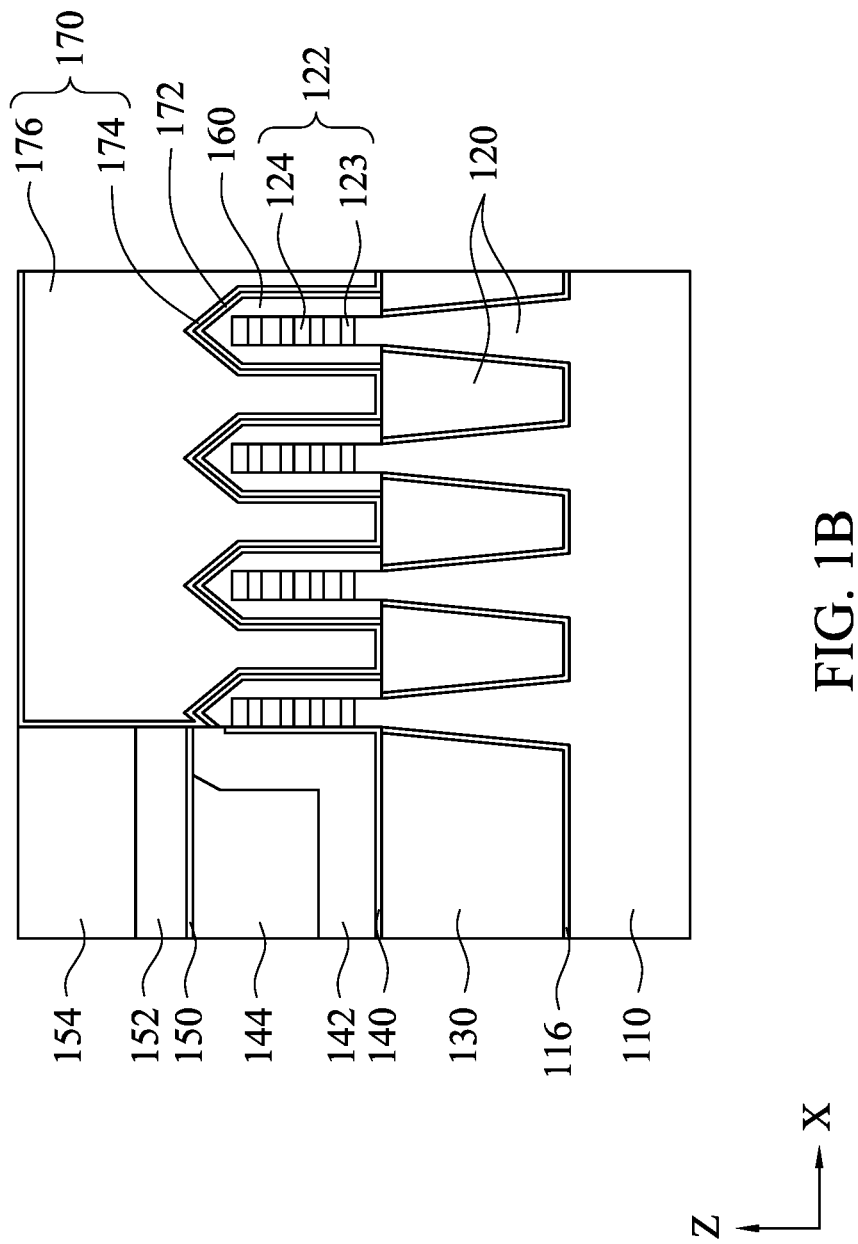
Figure 1C:
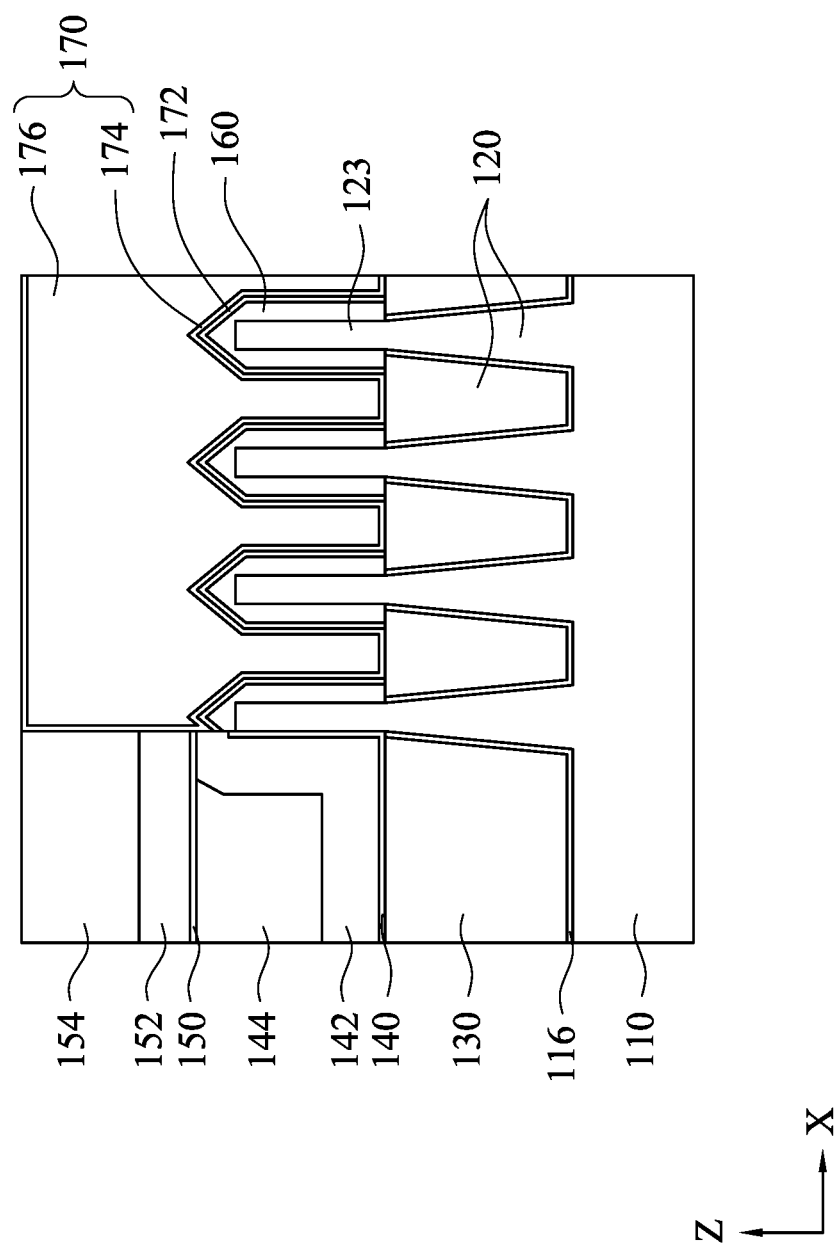
Figure 1D:
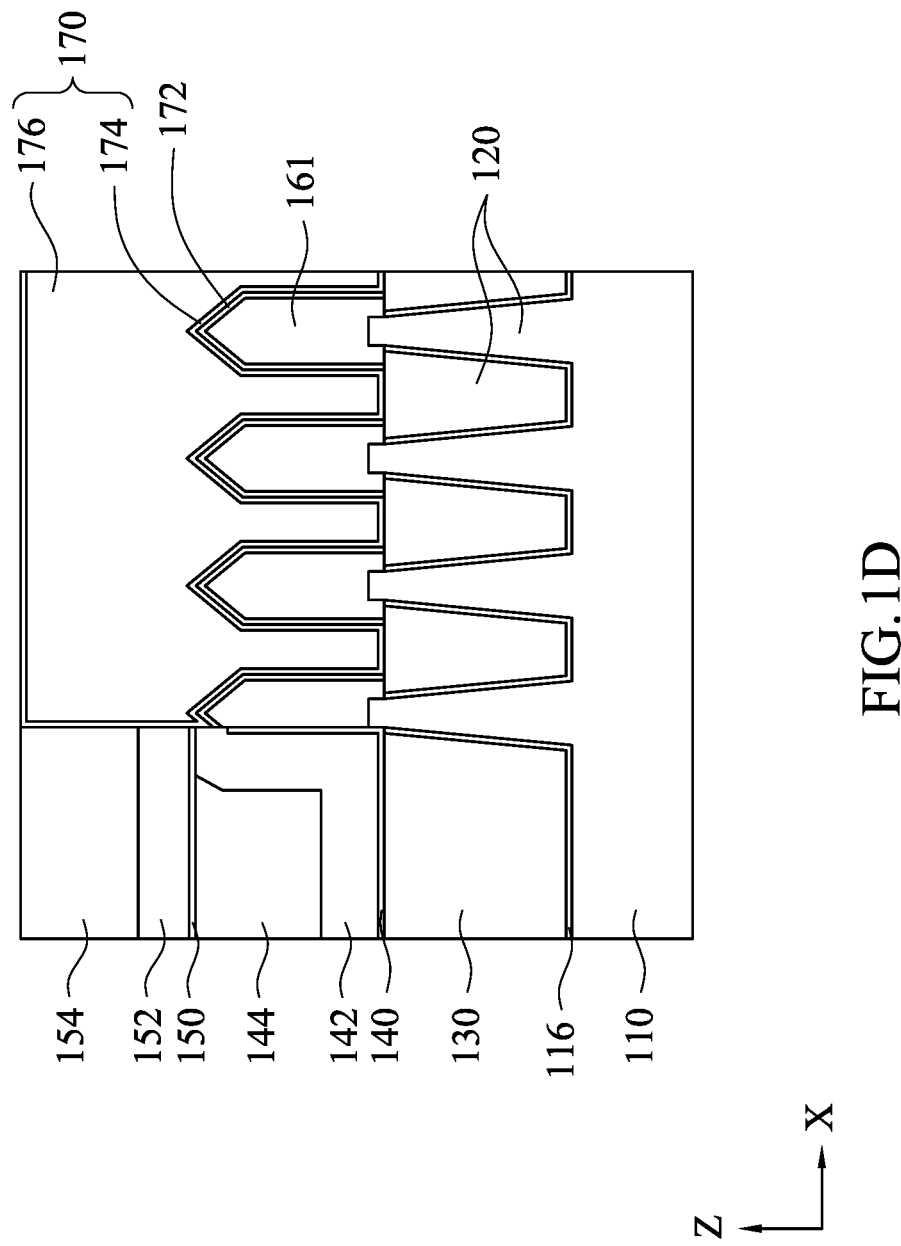

FIGS. 1A-1D show various views of a semiconductor test device according to an embodiment of the present disclosure. FIG. 1A is a perspective view and FIG. 1B is a cross sectional view of a semiconductor test device according to an embodiment of the present disclosure. FIGS. 1C and 1D show cross sectional views of semiconductor test devices according to other embodiments of the present disclosure.

In the present disclosure, as shown in FIGS. 1A-1D, the top and the sides of the source/drain epitaxial layer (e.g., 160) are fully covered (i.e., wrapped) by the contact layer (e.g., 170).

As shown in FIGS. 1A-1D, a plurality of semiconductor fin structures 120 are provided over a semiconductor substrate 110. In some embodiments, the substrate 110 includes a single crystalline semiconductor layer on at least its surface portion. The substrate 110 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 110 is made of crystalline Si.

The substrate 110 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 110 comprises silicon germanium (SiGe) buffer layers epitaxially grown on the silicon substrate 110. The germanium concentration of the SiGe buffer layers may increase from 30 atomic % germanium for the bottom-most buffer layer to 70 atomic % germanium for the top-most buffer layer.

The bottom part of the fin structures 120 are covered by an insulating layer 116 (a fin liner layer). The fin liner layer 116 includes one or more layers of insulating material.

An isolation insulating layer 130, such as shallow trench isolation (STI), is disposed in the trenches over the substrate 110. The isolation insulating layer 130 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 130 is formed through a process such as CVD, flowable CVD (FCVD), or a spin-on-glass process, although any acceptable process may be utilized.

As shown in FIGS. 1A-1D, upper portions 122 of the fin structures are exposed from the isolation insulating layer 130. In some embodiments, the upper portions 122 of the fin structures include stacked layers of first semiconductor layers 123 and second semiconductor layer 124, as shown in FIG. 1B. In other embodiments, as shown in FIG. 1C, the upper portions 123 are continuous structures of the fin structures 120. Further, in other embodiments, there are substantially no upper portions and epitaxial layers are formed over the bottom portions of the fin structures as shown in FIG. 1D.

As shown in FIGS. 1A-1C, a semiconductor epitaxial layer 160 is formed on respective upper portions 122 or 123. The semiconductor epitaxial layer 160 has the same structure as a source/drain epitaxial layer of FETs. In the case of FIG. 1D, a semiconductor epitaxial layer 161 is formed over the fin structures 120.

Further, an alloy layer 172 is formed on the epitaxial layer 160. The alloy layer 172 includes at least one of Si and Ge, and one or more of metallic elements, such as W, Ni, Co, Ti, Cu and/or Al. In some embodiments, the alloy layer is a silicide layer, such as WSi, CoSi, NiSi, TiSi, MoSi and/or TaSi.

A contact layer 170 is disposed over the alloy layer 172. The contact layer 170 includes one or more layers of conductive material, such as Co, Ni, W, Ti, Ta, Cu, Al, TiN and TaN. In some embodiments, the contact layer 170 includes a glue (adhesive) layer 174 and a body layer 176. In certain embodiments, the glue layer 174 is made of TiN and the body layer 176 includes one or more of Co, Ni, W, Ti, Ta, Cu and Al.

As shown in FIG. 1A, the contact layer 170 is formed in an opening 175 which is formed in one or more dielectric layers. As explained below, the dielectric layers include a first dielectric layer 140, a second dielectric layer 142, a third dielectric layer 144, a fourth dielectric layer 150, a fifth dielectric layer 152 and a sixth dielectric layer 154 in some embodiments. The dielectric layers are made of, for example, silicon oxide, silicon nitride, silicon oxynitride (SiON), SiOCN, SiCN, fluorine-doped silicate glass (FSG), or a low-K dielectric material.

As show in FIG. 1A, the number of the epitaxial layers (fin structures) within the opening is at least 5 in some embodiments, and at least 10 in other embodiments. The maximum number may be 30. The structures shown in FIGS. 1A-1D may hereinafter be called a resistance measurement structure.

Figure 2A:
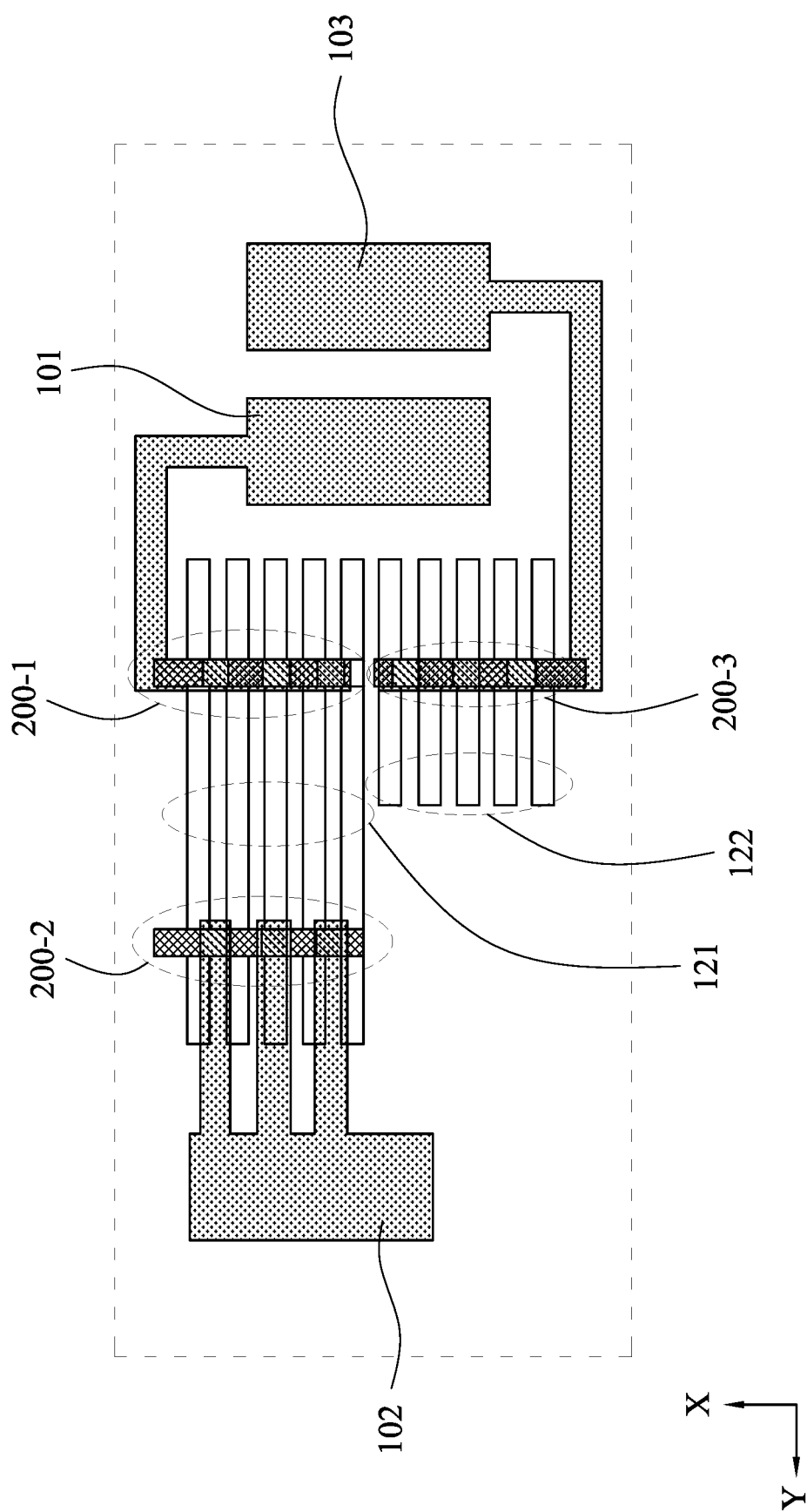
FIG. 2A is a plan view (layout) and FIG. 2B is a perspective view of a semiconductor test device according to an embodiment of the present disclosure.
Figure 2B:
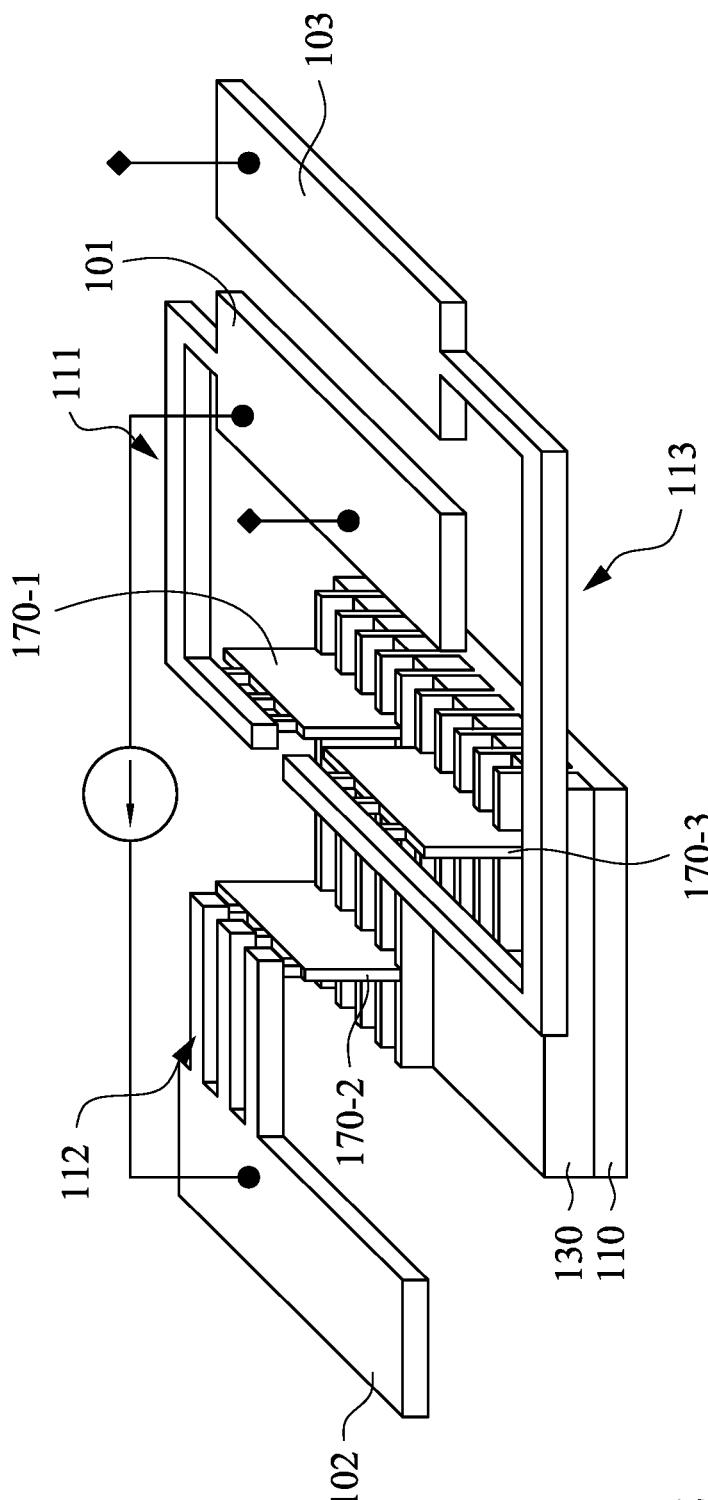
Figure 2C:
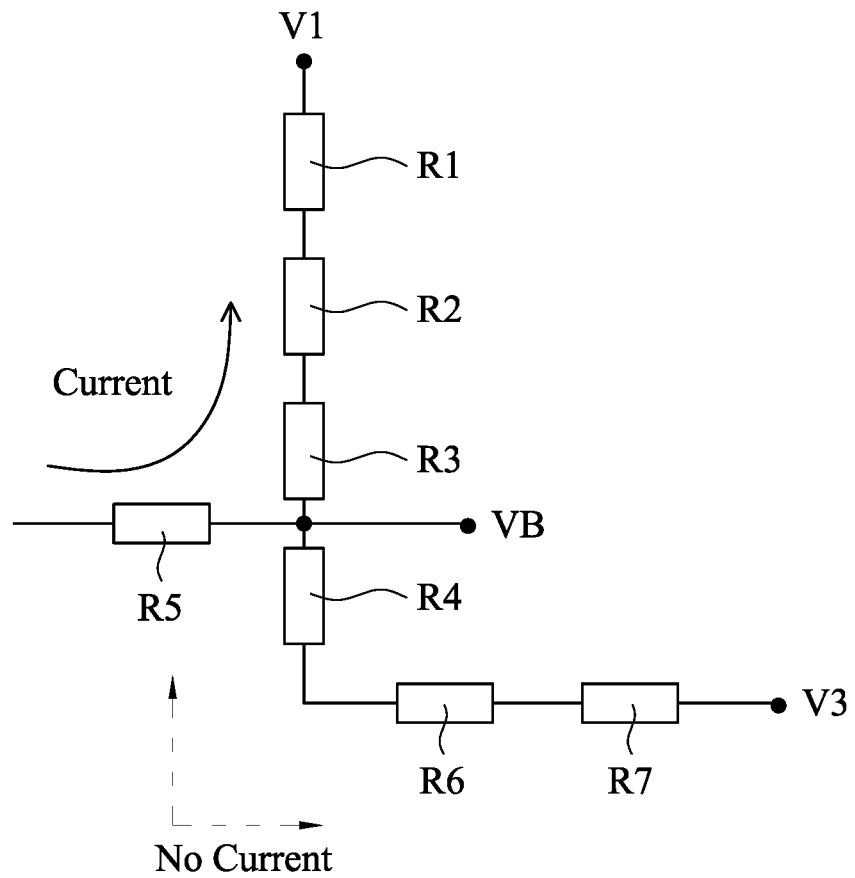
FIG. 2C is an equivalent circuit diagram of the semiconductor test device.

FIG. 2A is a plan view (layout) and FIG. 2B is a perspective view of a semiconductor test device according to an embodiment of the present disclosure. FIG. 2C is an equivalent circuit diagram of the semiconductor test device.

As shown in FIG. 2A, first fin structures 121 extend in the Y direction and second fin structures 122 extend in the Y direction and are disposed adjacent to the first fin structures 121 in the X direction. Although five first and second fin structures are illustrated, the numbers of the first and second fin structures are not limited to five.

A first resistance measurement structure 200-1 is disposed at a first point of the first fin structures 121 and a second resistance measurement structure 200-2 is disposed at a second point of the first fin structure 121. The first point and the second point are spaced apart from each other in the Y direction by a distance of about 100 nm to about 2 μm in some embodiments. A third resistance measurement structure 200-3 is disposed at a third point of the second fin structure 122. The first point and the third point are located at substantially the same Y position.

The contact layer 170-1 of the first resistance measurement structure 200-1 is connected to a first pad 101 via one or more first wirings 111, the contact layer 170-2 of the second resistance measurement structure 200-2 is connected to a second pad 102 via one or more second wirings 112, and the contact layer 170-3 of the third resistance measurement structure 200-3 is connected to a third pad 103 via one or more third wirings 113.

Next, a contact resistance measurement method will be explained referring to FIGS. 2A-2C. Voltage V is applied between the first pad 101 and the second pad 102 so that a current I flows between the first contact resistance measurement structure 200-1 and the second contact resistance measurement structure 200-2 via the first fin structures 121. Then, voltage V1 at the first pad 101 and voltage V3 at the third pad 103 is measured. Here, the third pad 103 is electrically coupled to the substrate 110 via the third wirings 113 and the third contact resistance measurement structure 200-3, no current flows in the third wiring 113. Thus, V3 is substantially equal to the voltage VB at the substrate or at the bottom portions of the fin structures under the first resistance measurement structure 200-1. In FIG. 2C, R1 is a resistance of a via or a contact plug portion disposed on the contact layer 170-1, R2 is a resistance of the contact layer 170-1, R3 is a contact resistance between the contact layer 170-1 and the epitaxial layer 160 of the source/drain region, R4 is a resistance of the well region (bottom of the semiconductor fin structures 120), R5 is resistance of the contact layer 170-3, R6 is a resistance of the contact layer 170-3, and R7 is a resistance of a via or a contact plug portion disposed on the contact layer 170-3.

By the following equation, the contact resistance R can be obtained:

$$\frac{V3 - V1}{I} = R = R1 + R2 + R3$$

FIGS. 3A-21C show exemplary sequential processes for manufacturing the semiconductor test device according to one embodiment of the present disclosure. It is understood that additional operations can be provided before, during, and after processes shown by FIGS. 3A-21C, and some of the operations described below can be replaced or eliminated, for additional embodiments of the method. The order of the operations/processes may be interchangeable. In FIGS. 3A-21C, the "A" figures (e.g., FIGS. 3A, 4A, ...) are perspective views, the "B" figures (FIGS. 3B, 4B, ...) are cross sectional view along the X direction, and the "C" figures (e.g., FIGS. 12C, 13C, ...) are cut views along the X direction.

It is noted that the semiconductor test structure is formed together with functional circuit devices including FinFETs and/or GAA FETs.

Figure 3A:
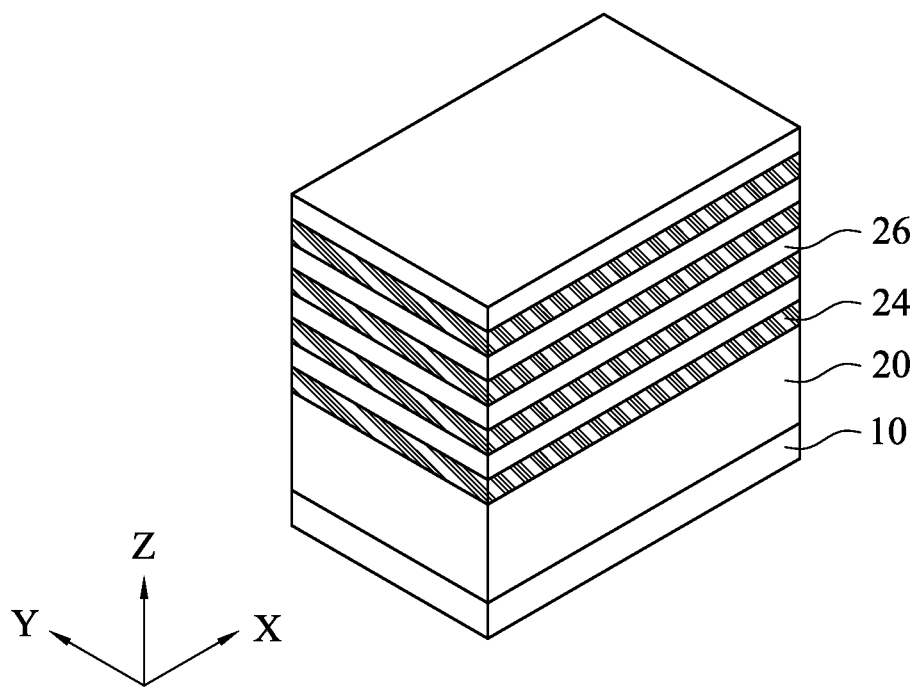
FIG. 3A shows a perspective view and FIG. 3B shows a cross sectional view of one of the various stages of manufacturing a semiconductor test device according to an embodiment of the present disclosure.
Figure 3B:
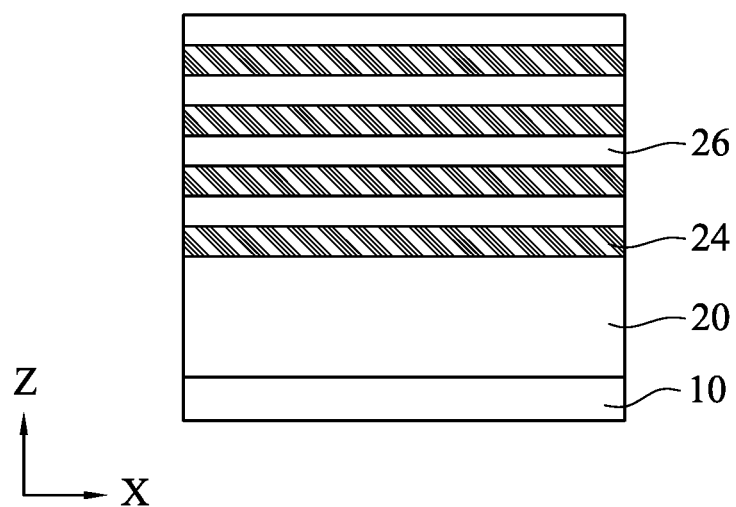

As shown in FIGS. 3A and 3B, stacked semiconductor layers are formed over a substrate 10. The stacked semiconductor layers include first semiconductor layers 24 and second semiconductor layers 26. Further, a buffer layer 20 is formed between the substrate 10 and the stacked semiconductor layers.

The first semiconductor layers 22 and the second semiconductor layers 24 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 22 and the second semiconductor layers 24 are made of Si, a Si compound, SiGe, Ge or a Ge compound. In one embodiment, the first semiconductor layers 22 are $Si_{1-x}Ge_x$, where x is more than about 0.3, or Ge (x=1.0) and the second semiconductor layers 24 are Si or $Si_{1-y}Ge_y$, where y is less than about 0.4, and x>y. In this disclosure, an "M" compound" or an "M based compound" means the majority of the compound is M. In another embodiment, the second semiconductor layers 24 are $Si_{1-y}Ge_y$, where y is more than about 0.3, or Ge, and the first semiconductor layers 22 are Si or $Si_{1-x}Ge_x$, where x is less than about 0.4, and x<y. In yet other embodiments, the first semiconductor layer 22 is made of $Si_{1-x}Ge_x$, where x is in a range from about 0.3 to about 0.8, and the second semiconductor layer 24 is made of $Si_{1-y}Ge_y$, where y is in a range from about 0.1 to about 0.4. The buffer layer 20 is made of $Si_{1-z}Ge_z$, where z>x and/or y.

In FIGS. 3A and 3B, four layers of the first semiconductor layer 22 and four layers of the second semiconductor layer 24 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 22 and the second semiconductor layers 24 are epitaxially formed over the buffer layer 20. The thickness of the first semiconductor layers 22 may be equal to or greater than that of the second semiconductor layers 24, and is in a range from about 2 nm to about 20 nm in some embodiments, and is in a range from about 3 nm to about 10 nm in other embodiments. The thickness of the second semiconductor layers 24 is in a range from about 2 nm to about 20 nm in some embodiments, and is in a range from about 3 nm to about 10 nm in other embodiments. The thickness of each of the first semiconductor layers 22 and/or the thickness of each of the second semiconductor layers may be the same, or may vary. The thickness of the buffer layer 20 is in a range from about 10 nm to about 50 nm in some embodiments, or is in a range from 20 nm to 40 nm in other embodiments.

In some embodiments, instead of forming a stacked structure, a single epitaxial layer is formed over the substrate 10 or the buffer layer 20. In such a case, the single epitaxial layer is made of $Si_{1-s}Ge_s$, where 0.1<s≤1.0, and has a thickness about 30 nm to 100 nm, in some embodiments.

Figure 4A:
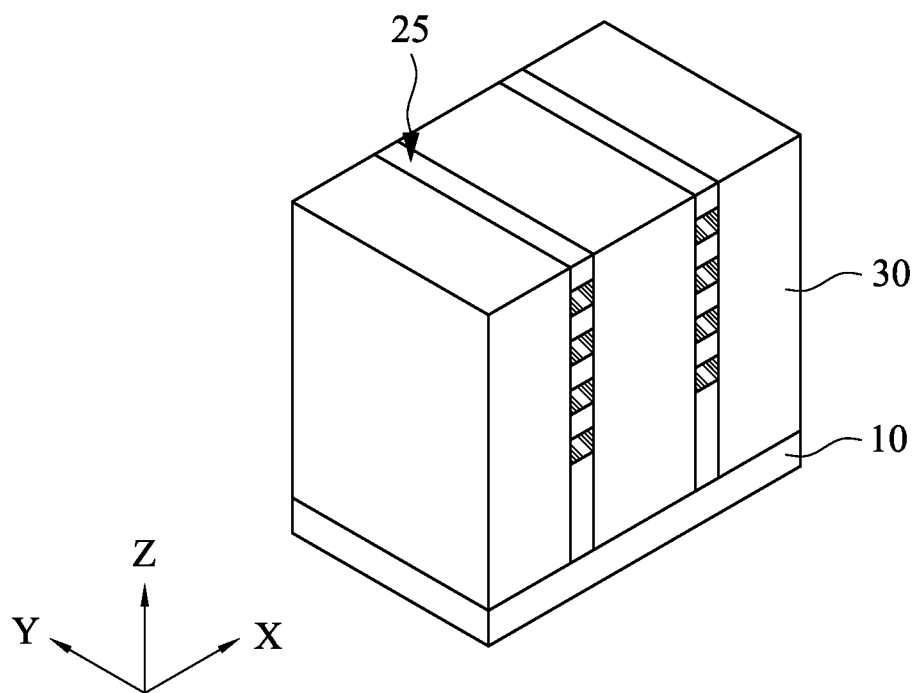
FIG. 4A shows a perspective view and FIG. 4B shows a cross sectional view of one of the various stages of manufacturing a semiconductor test device according to an embodiment of the present disclosure.
Figure 4B:
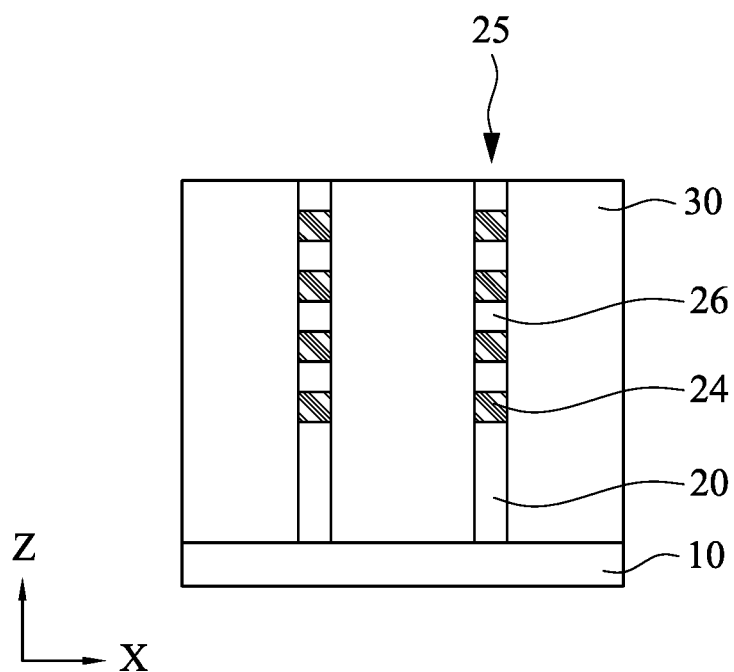

Next, the stacked layers of the first and second semiconductor layers 22, 24 are patterned into fin structures 25 extending in the Y direction, as shown in FIGS. 4A and 4B. In FIGS. 4A and 4B, two fin structures 25 are arranged in the X direction. But the number of the fin structures is not limited to two, and may be five or more (e.g., 10). In some embodiments, one or more dummy fin structures are formed on both sides of the fin structures 25 to improve pattern fidelity in the patterning operations.

The width of the fin structure along the X direction is in a range from about 4 nm to about 10 nm in some embodiments, and is in a range from about 4 nm to about 8 nm in other embodiments. The pitch of the fin structures 25 is in a range from about 10 nm to about 50 nm in some embodiments, and is in a range from about 12 nm to about 40 nm in other embodiments.

The stacked fin structure 25 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 25.

After the fin structures 25 are formed, an insulating material layer 30 including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD (FCVD). An anneal operation may be performed after the formation of the insulating layer. Then, a planarization operation, such as a chemical mechanical polishing (CMP) method and/or an etch-back method, is performed such that the upper surface of the uppermost second semiconductor layer 26 is exposed from the insulating material layer, as shown in FIGS. 4A and 4B. In some embodiments, a fin liner layer (not shown) is formed over the fin structures before forming the insulating material layer. The fin liner layer is made of SiN or a silicon nitride-based material (e.g., SiON, SiCN or SiOCN).

Figure 5A:
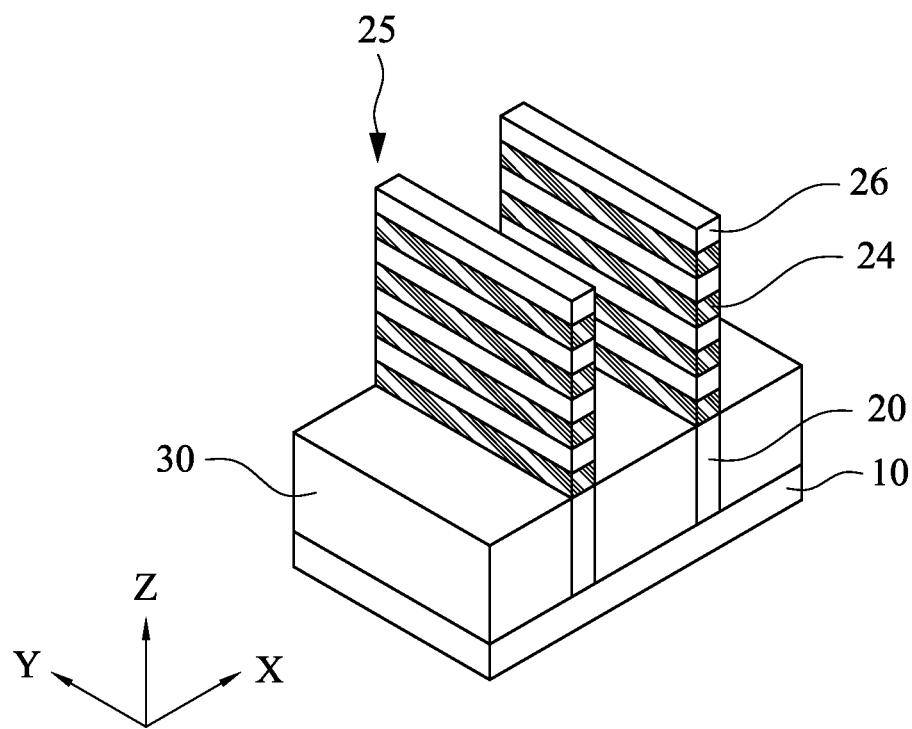
FIG. 5A shows a perspective view and FIG. 5B shows a cross sectional view of one of the various stages of manufacturing a semiconductor test device according to an embodiment of the present disclosure.
Figure 5B:
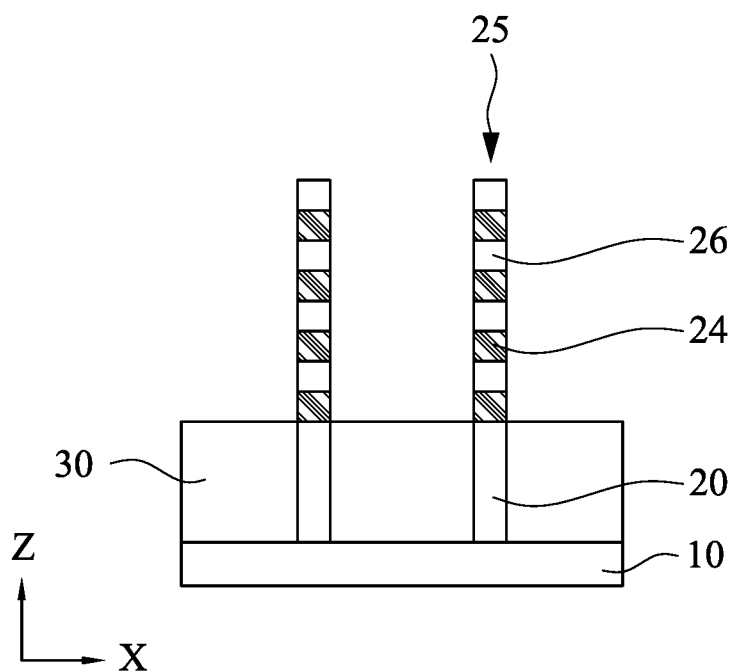

Then, as shown in FIGS. 5A and 5B, the insulating material layer is recessed to form an isolation insulating layer 30 so that the upper portions of the fin structures 25 are exposed. With this operation, the fin structures 25 are electrically separated from each other by the isolation insulating layer 30, which is also called shallow trench isolation (STI). The height of the exposed portions of the fin structures 25 is in a range from about 30 nm to about 100 nm in some embodiments.

In the embodiment shown in FIGS. 5A and 5B, the insulating material layer is recessed until the upper portion of the buffer layer 20 is slightly exposed. In other embodiments, the upper portion of the buffer layer 20 is not exposed.

Figure 6A:
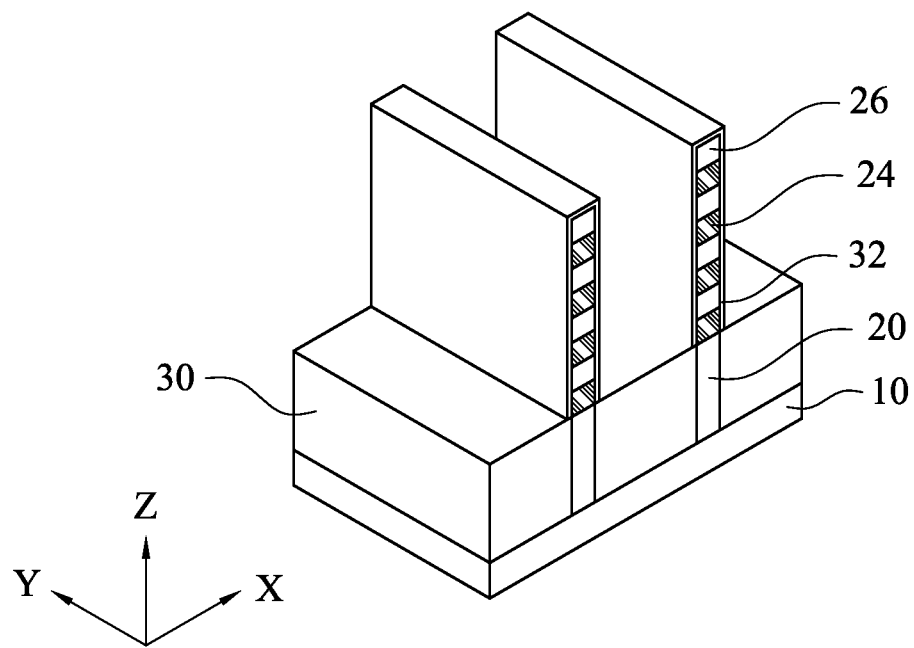
FIG. 6A shows a perspective view and FIG. 6B shows a cross sectional view of one of the various stages of manufacturing a semiconductor test device according to an embodiment of the present disclosure.
Figure 6B:
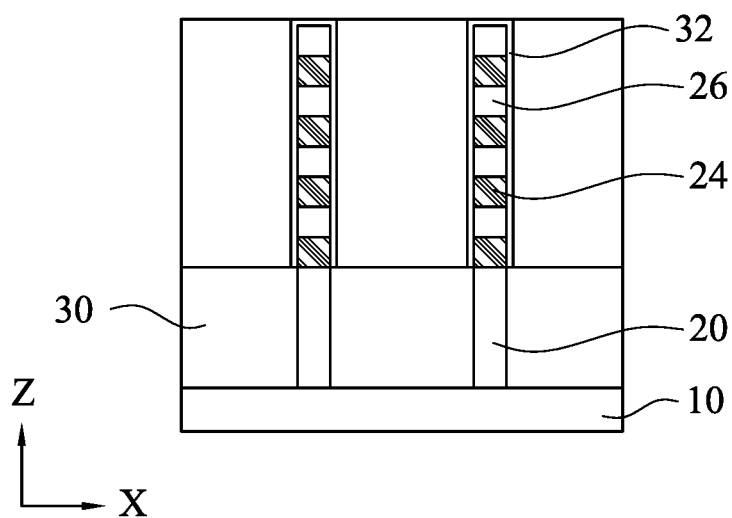

After the isolation insulating layer 30 is formed, a first insulating layer 32 is formed to fully cover the exposed fin structures 25, as shown in FIGS. 6A and 6B. The first insulating layer 32 includes silicon oxide, silicon nitride, silicon oxynitride (SiON), SiOCN and/or SiCN, or other suitable insulating material. In certain embodiments, the first insulating layer 32 is made of silicon oxide, with a thickness of about 1 nm to 3 nm formed by ALD and/or CVD.

Figure 7A:
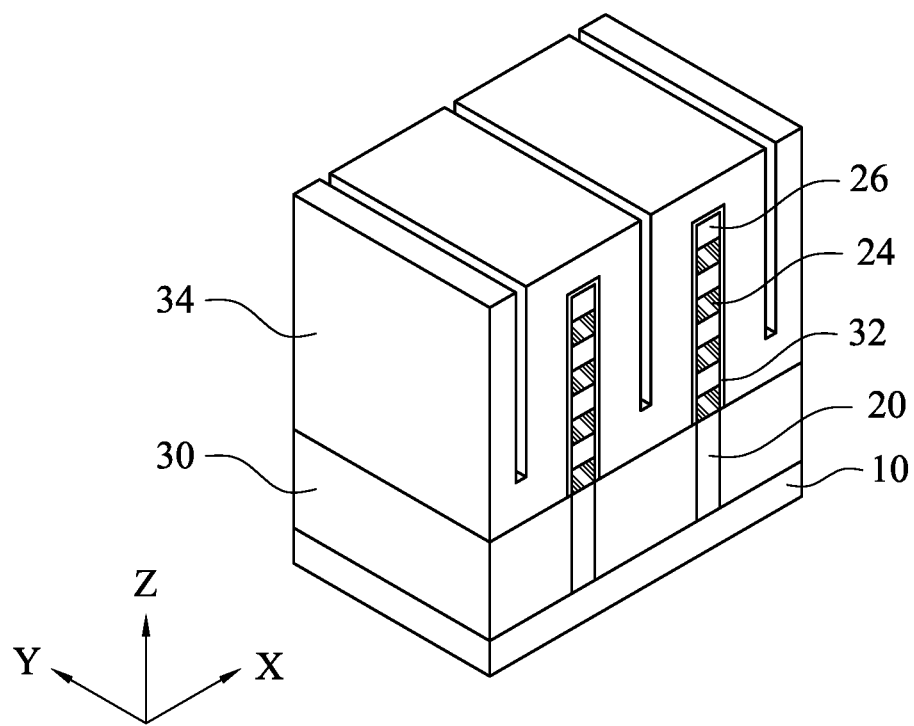
FIG. 7A shows a perspective view and FIG. 7B shows a cross sectional view of one of the various stages of manufacturing a semiconductor test device according to an embodiment of the present disclosure.
Figure 7B:
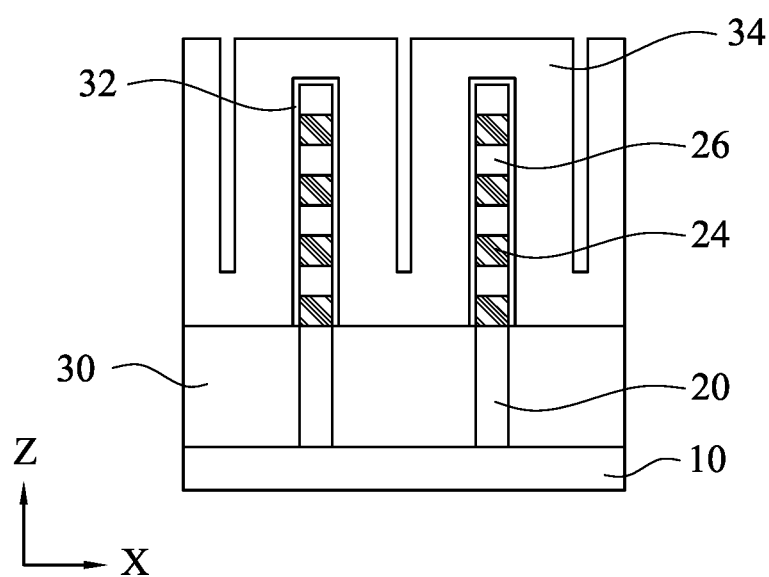

Then, a second insulating layer 34 is formed on the first insulating layer 32 and over the isolation insulating layer 30, as shown in FIGS. 7A and 7B. The second insulating layer 34 includes silicon oxide, silicon nitride, silicon oxynitride (SiON), SiOCN and/or SiCN, or other suitable insulating material. In certain embodiments, the second insulating layer 34 is made of silicon nitride, with a thickness of about 10 nm to 15 nm formed by ALD and/or CVD. In some embodiments, the second insulating layer 34 is conformally formed.

Figure 8A:
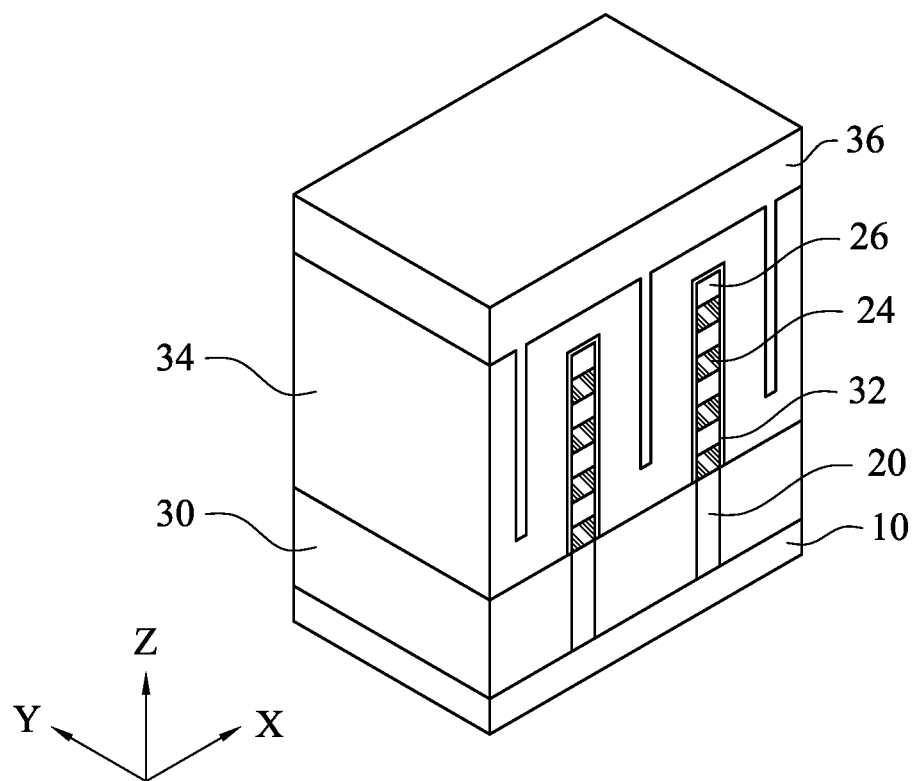
FIG. 8A shows a perspective view and FIG. 8B shows a cross sectional view of one of the various stages of manufacturing a semiconductor test device according to an embodiment of the present disclosure.
Figure 8B:
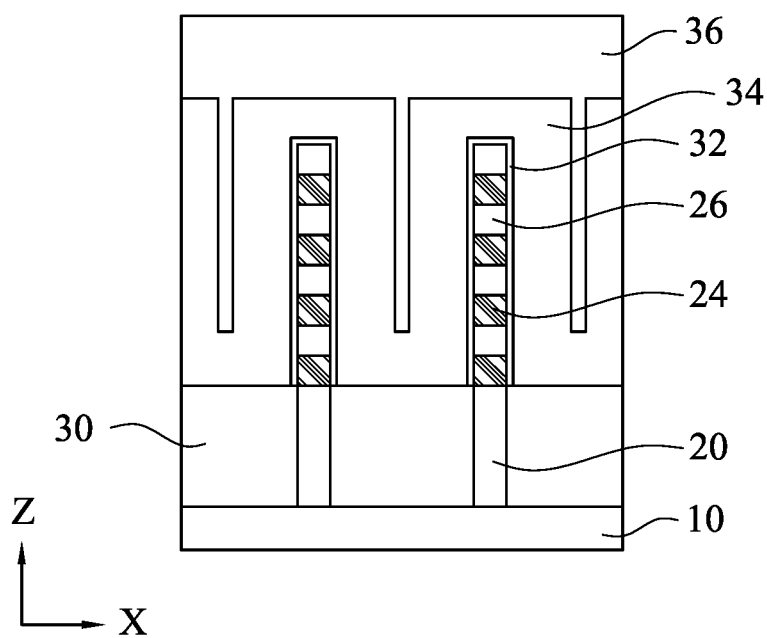

Further, a third insulating layer 36 is formed on the second insulating layer 34, as shown in FIGS. 8A and 8B. The third insulating layer 36 includes silicon oxide, silicon nitride, silicon oxynitride (SiON), SiOCN and/or SiCN, or other suitable insulating material. In certain embodiments, the third insulating layer 36 is made of silicon oxide formed by FCVD. In some embodiments, after the third insulating layer 36 is formed by FCVD, an annealing operation is performed.

Figure 9A:
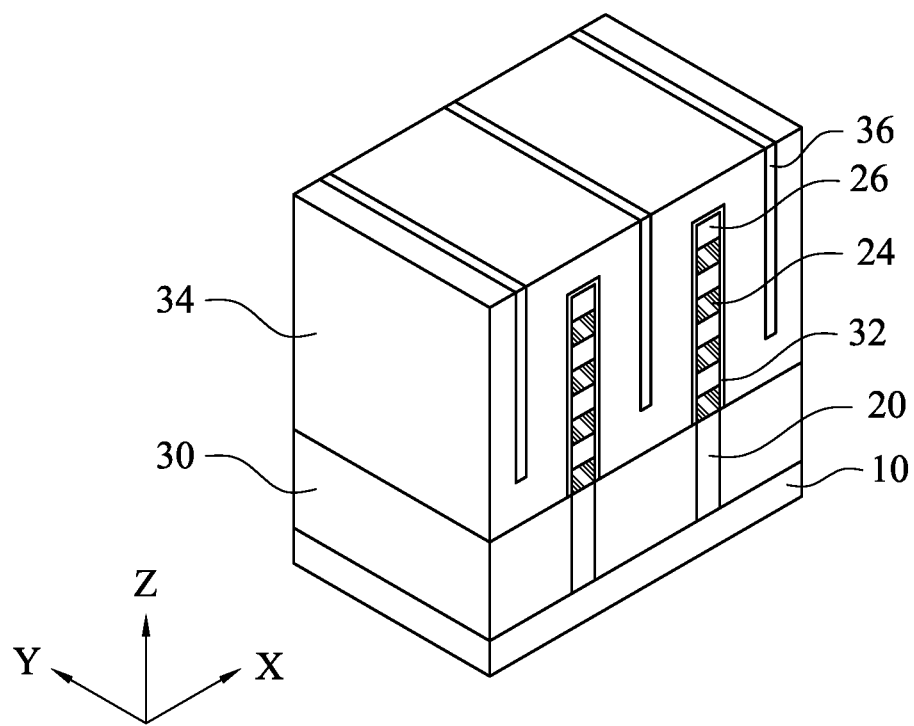
FIG. 9A shows a perspective view and FIG. 9B shows a cross sectional view of one of the various stages of manufacturing a semiconductor test device according to an embodiment of the present disclosure.
Figure 9B:
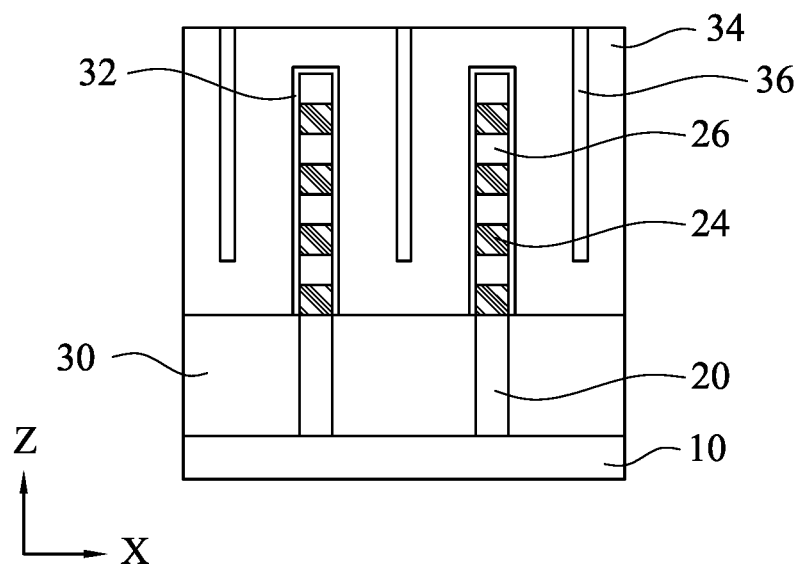

Subsequently, a planarization operation, such as CMP, is performed to remove excess portion of the third insulating layer 36 and to expose the second insulating layer 34, as shown in FIGS. 9A and 9B. In some embodiments, after the CMP operation, an annealing operation is performed.

Figure 10A:
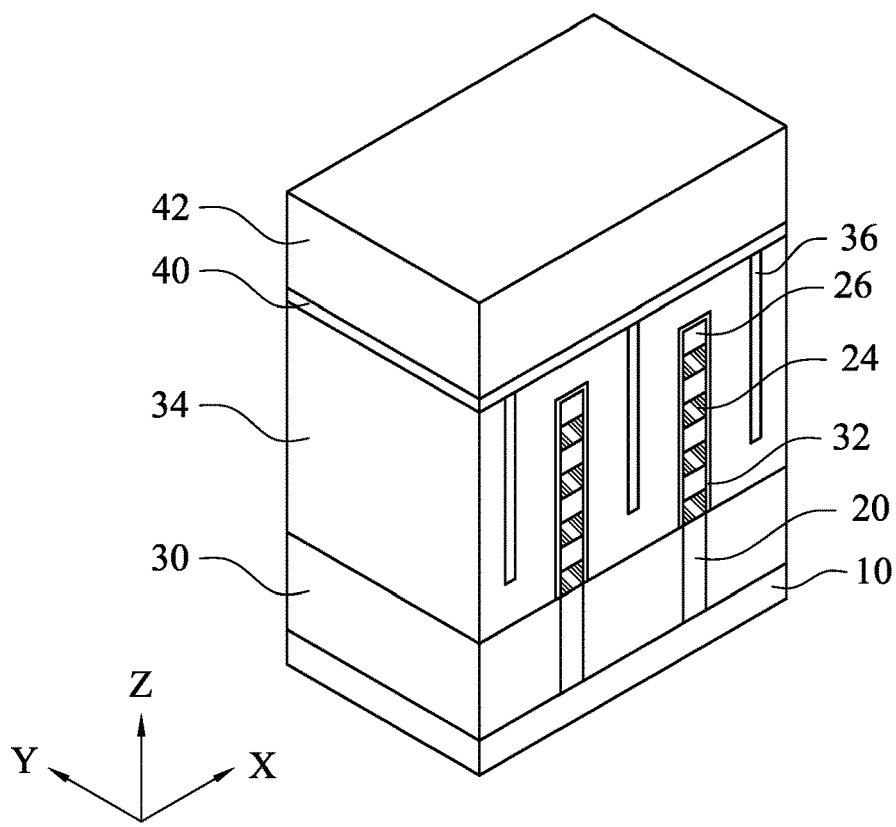
FIG. 10A shows a perspective view and FIG. 10B shows a cross sectional view of one of the various stages of manufacturing a semiconductor test device according to an embodiment of the present disclosure.
Figure 10B:
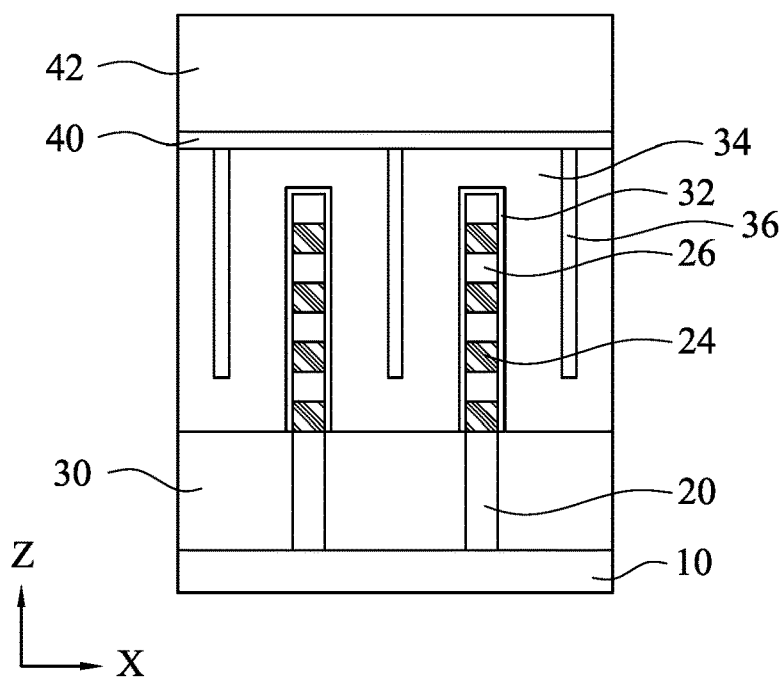

Then, a fourth insulating layer 40 is formed on the second and third insulating layers 34, 36, and a fifth insulating layer 42 is further formed on the fourth insulating layer 40, as shown in FIGS. 10A and 10B. The fourth and fifth insulating layers are made of different materials and include silicon oxide, silicon nitride, silicon oxynitride (SiON), SiOCN and/or SiCN, or other suitable insulating material. In certain embodiments, the fourth insulating layer 40 is made of silicon oxide, with a thickness of about 1 nm to 3 nm formed by ALD and/or CVD, and the fifth insulating layer 42 is made of silicon nitride, with a thickness of about 10 nm to 30 nm formed by ALD and/or CVD.

Figure 11B:
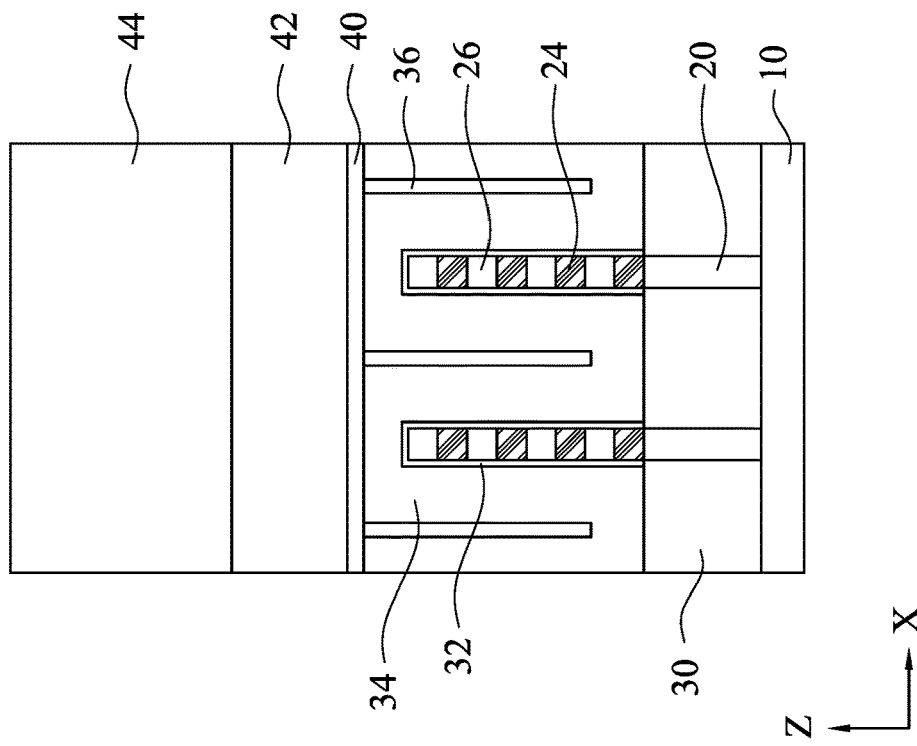
FIG. 11A shows a perspective view and FIG. 11B shows a cross sectional view of one of the various stages of manufacturing a semiconductor test device according to an embodiment of the present disclosure.
Figure 11A:
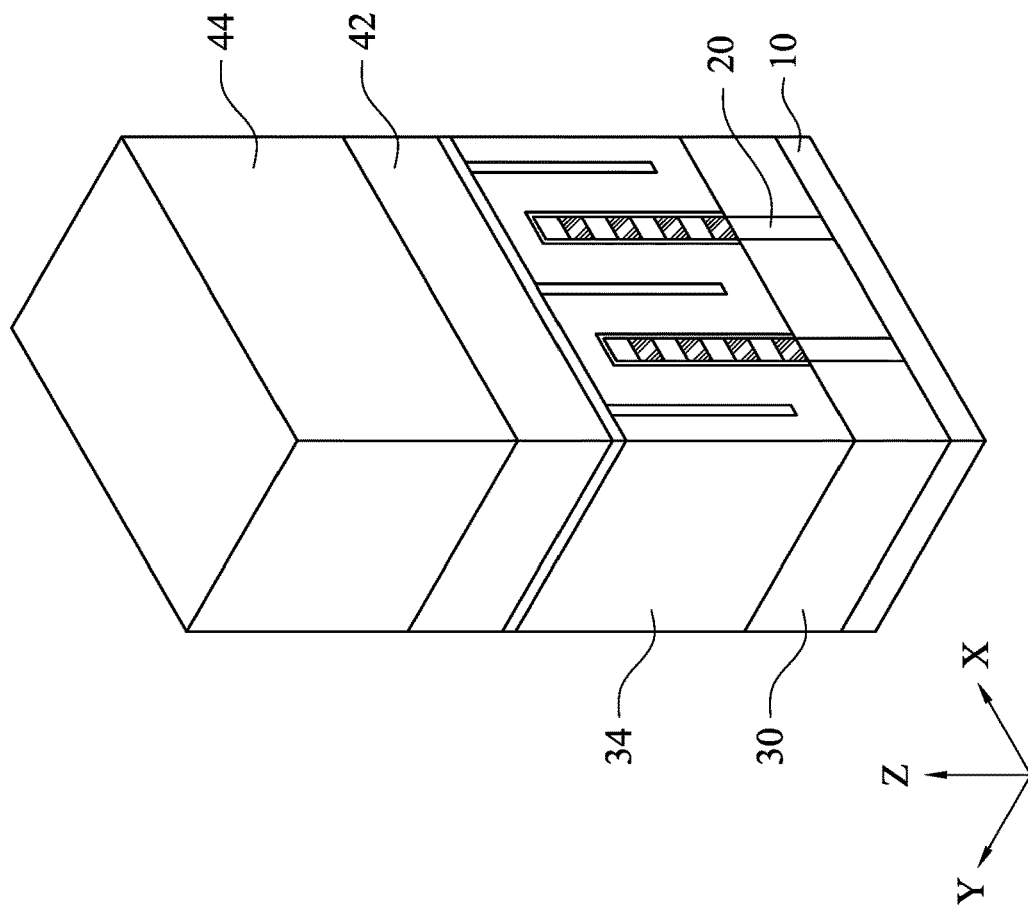

Further, as shown in FIGS. 11A and 11B, a sixth insulating layer 44 is formed on the fifth insulating layer 42. The sixth insulating layer 44 includes silicon oxide, silicon nitride, silicon oxynitride (SiON), SiOCN and/or SiCN, or other suitable insulating material. In certain embodiments, the sixth insulating layer 44 is made of silicon oxide, with a thickness of about 40 nm to 60 nm formed by ALD and/or CVD.

Figure 12B:
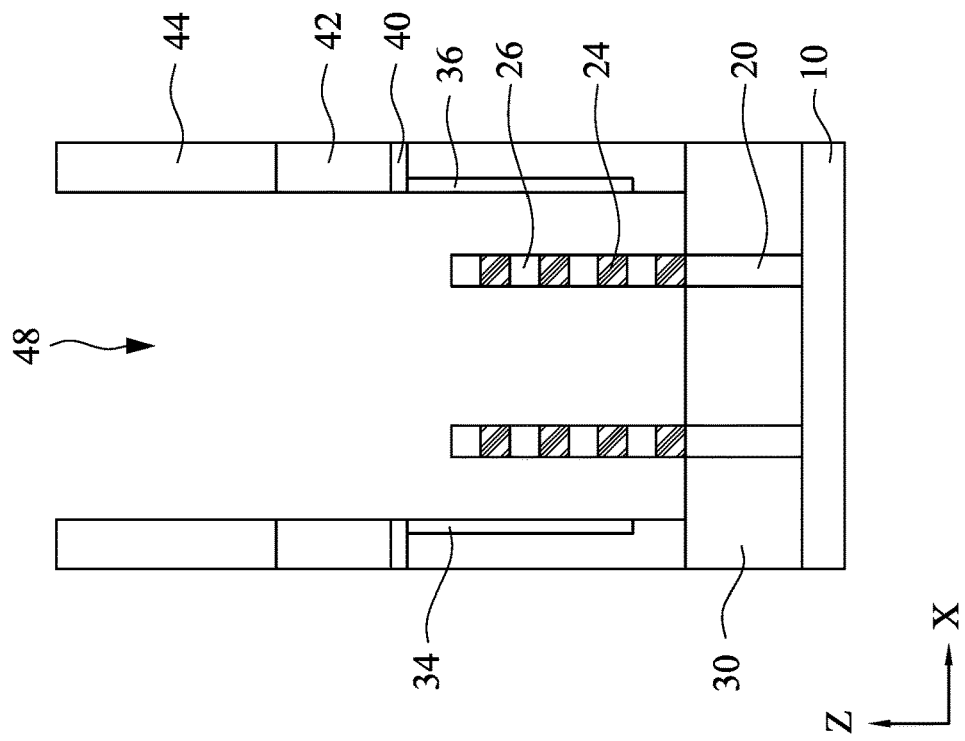
FIG. 12B shows a cross sectional view and FIG. 12C is a cut view of one of the various stages of manufacturing a semiconductor test device according to an embodiment of the present disclosure.
Figure 12A:
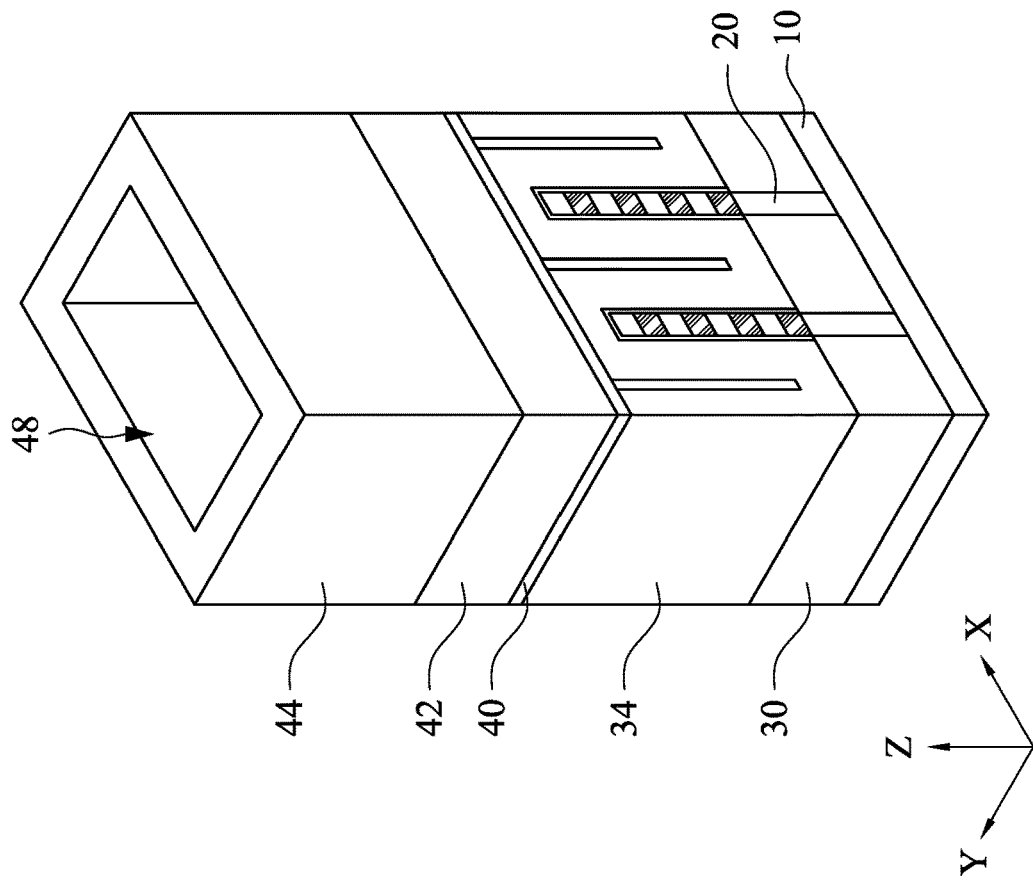
FIG. 12A shows a perspective view.
Figure 12C:
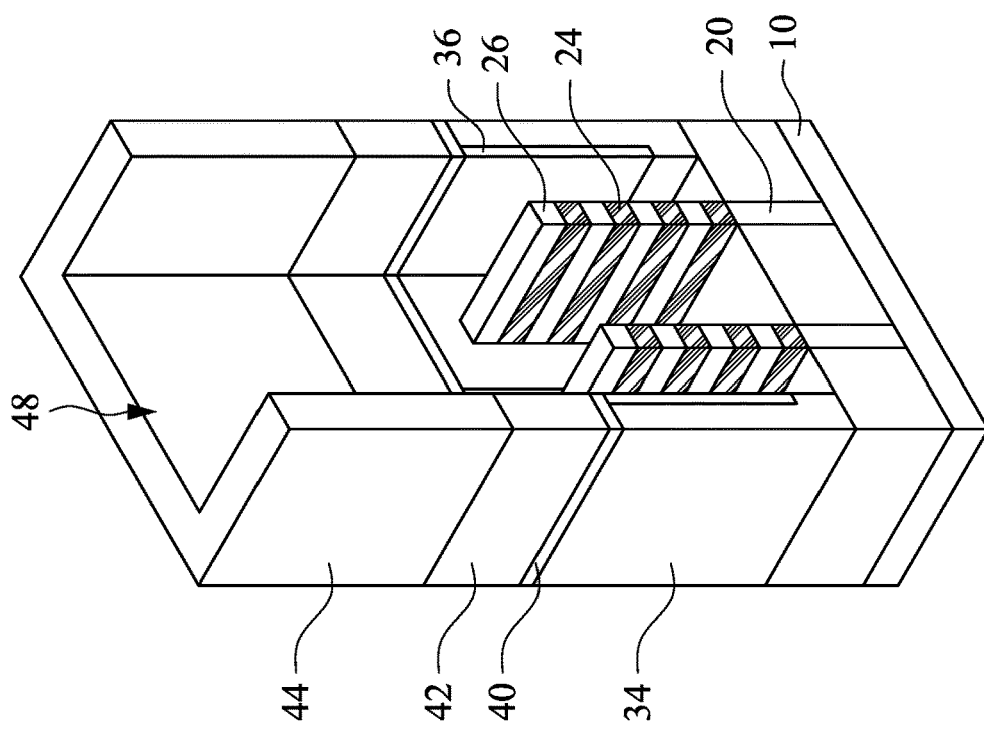
Figure 14B:
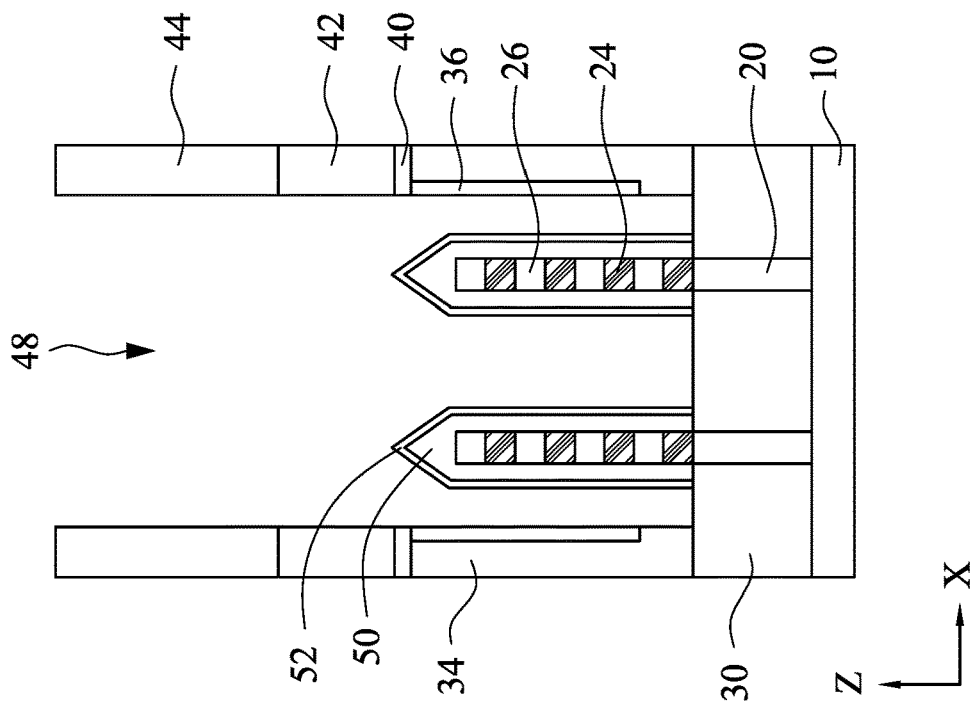
FIG. 14B shows a cross sectional view and FIG. 14C is a cut view of one of the various stages of manufacturing a semiconductor test device according to an embodiment of the present disclosure.
Figure 14A:
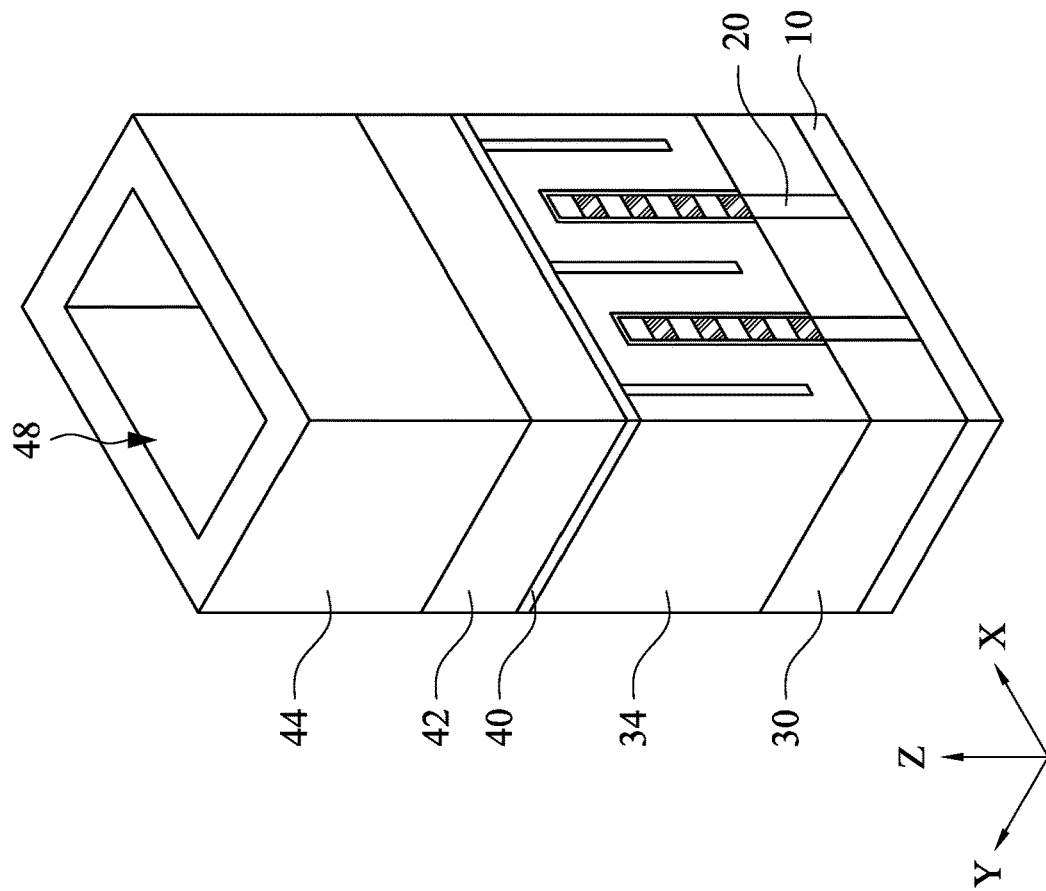
FIG. 14A shows a perspective view.
Figure 14C:
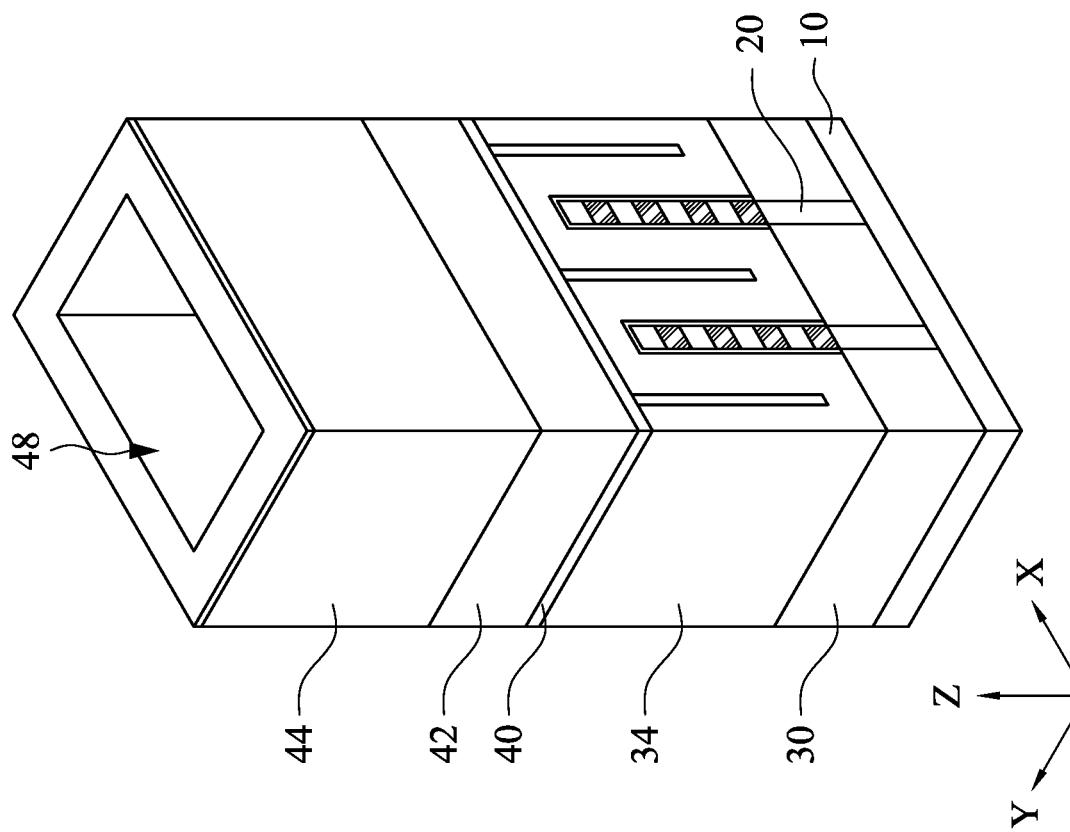

Next, a patterning operation, including one or more lithography operations and dry etching operations, is performed on the stacked insulating layers to form an opening 48 as shown in FIGS. 12A-12C. By the patterning operation, the upper portions of the fin structures 25 and the upper surface of the isolation insulating layer 30 are exposed inside the opening 48.

Figure 13A:
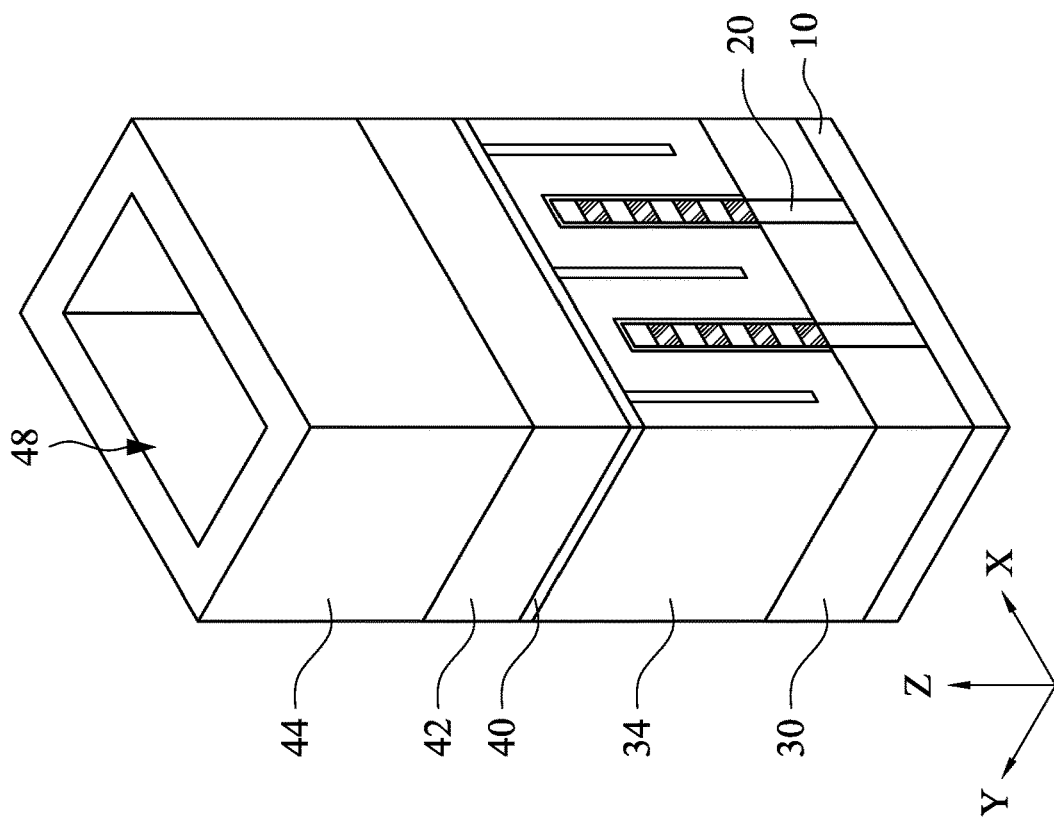
FIG. 13A shows a perspective view.

Subsequently, an epitaxial layer 50 is formed around the exposed fin structures 25, as shown in FIGS. 13A-13C. The epitaxial layer 50 is formed by the same operation to form source/drain epitaxial layers for FinFETs and/or GAA FETs. The epitaxial layer 50 includes one or more layers of SiP, SiAs, SiC and SiCP for testing n-channel FETs or one or more layers of SiB, SiGa, SiGe and SiGeB for testing p-channel FETs. In some embodiments, dopants are introduced into the epitaxial layer 50 at a concentration in a range from about $5 \times 10^{20}$ cm$^{-3}$ to about $6 \times 10^{21}$ cm$^{-3}$. The epitaxial layer 50 fully wraps around the exposed fin structures respectively, and does not merge with the adjacent epitaxial layer.

Then, as shown in FIGS. 14A-14D, a silicide layer 52 is formed over the epitaxial layer 50. The silicide layer 52 includes one or more of WSi, CoSi, NiSi, TiSi, RuSi, MoSi and TaSi. A metal layer is first formed over the epitaxial layer 50 and then an annealing operation is performed to form the silicide layer 52. In some embodiments, the silicide layer has a thickness in a range from about 2 nm to about 4 nm.

Figure 15A:
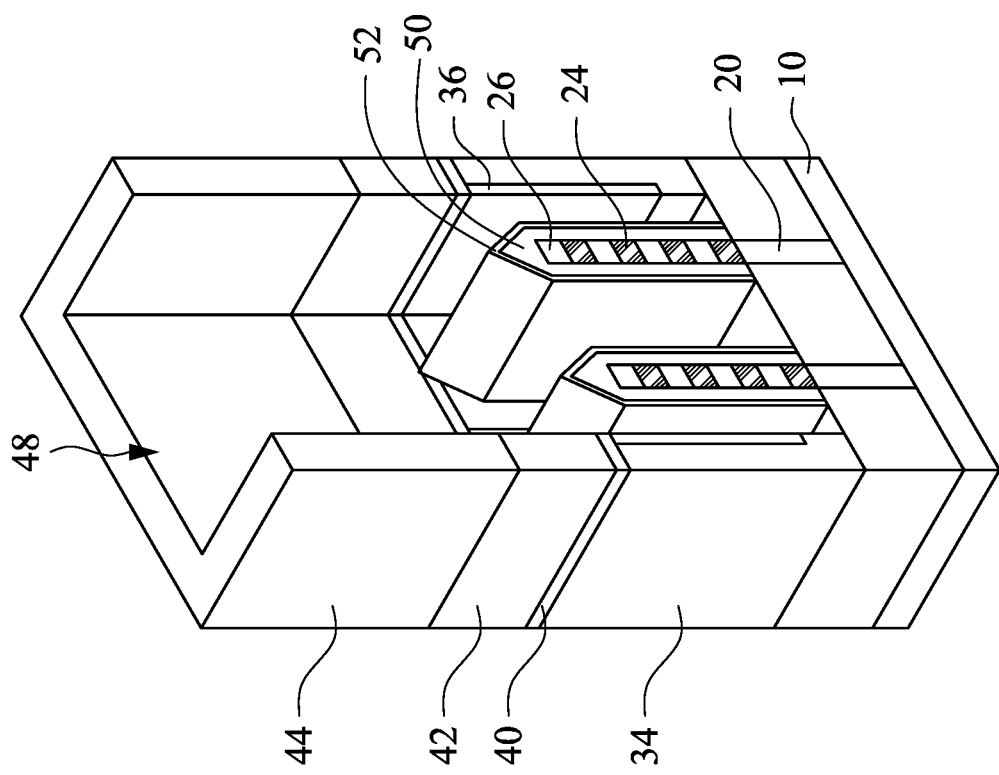
FIG. 15A shows a perspective view.
Figure 15C:
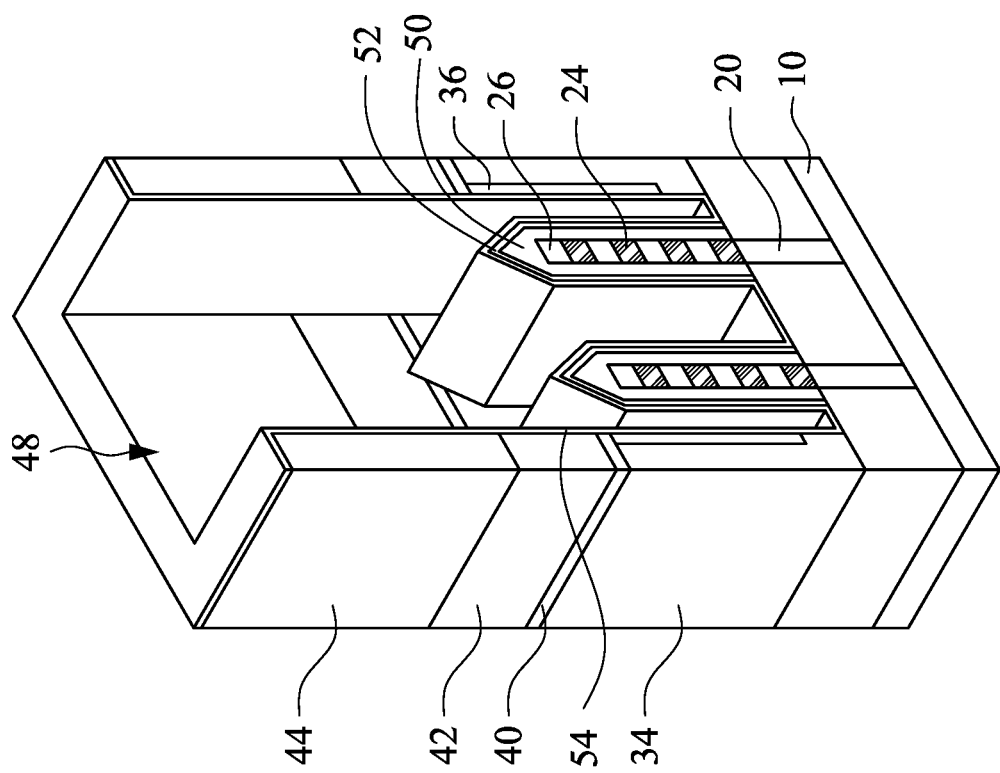
FIG. 15B shows a cross sectional view and FIG. 15C is a cut view of one of the various stages of manufacturing a semiconductor test device according to an embodiment of the present disclosure.
Figure 15B:
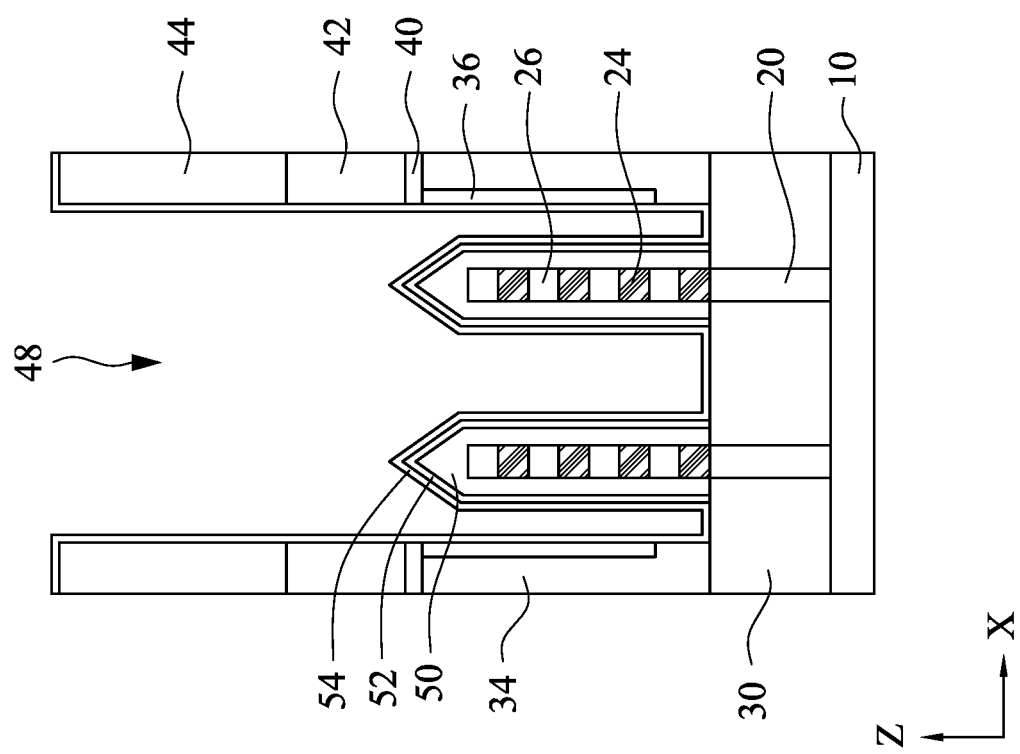

Next, a glue layer 54 is formed inside the opening 48 and over the sixth insulating layer 44, as shown in FIGS. 15A-15C. The silicide layer 52 is covered by the glue layer 54. In some embodiments, the glue layer includes TiN formed by CVD, PVD and/or ALD or other suitable methods, and has a thickness in a range from about 1 nm to about 4 nm.

Figure 16A:
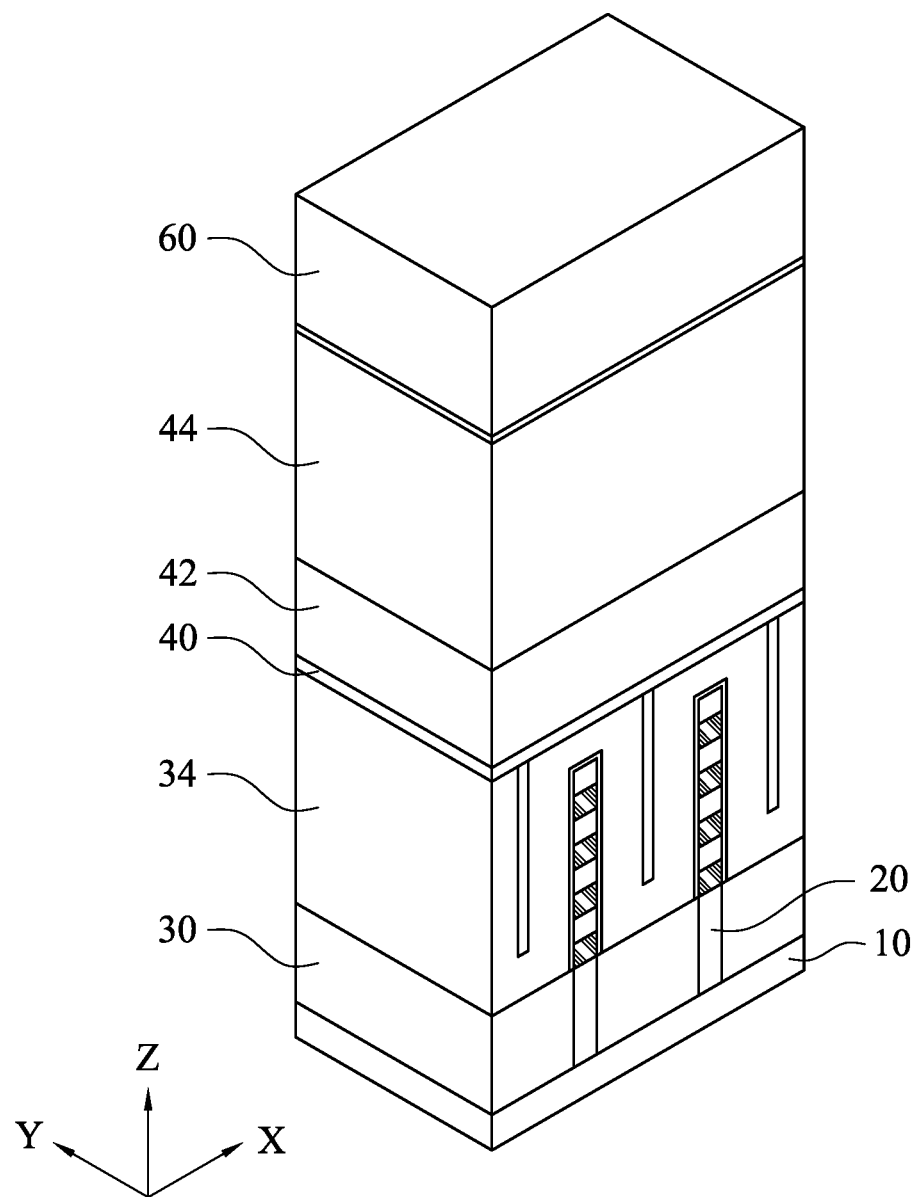
FIG. 16A shows a perspective view.
Figure 16B:
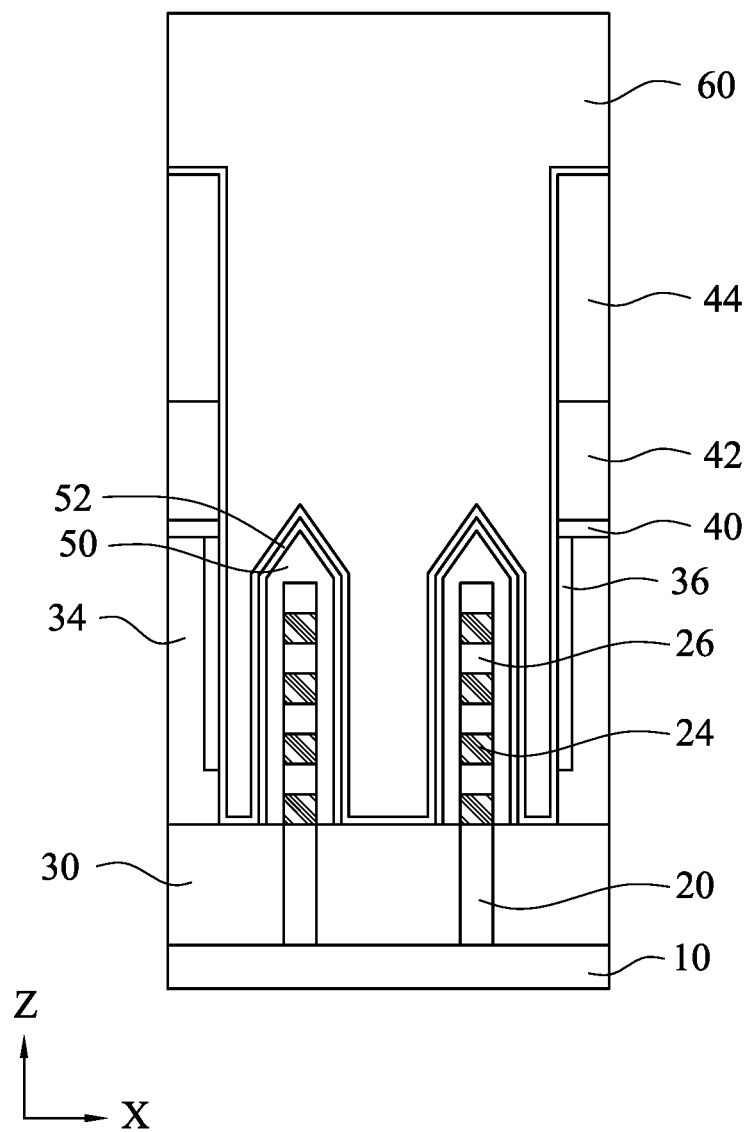
FIG. 16B shows a cross sectional view and FIG. 16C is a cut view of one of the various stages of manufacturing a semiconductor test device according to an embodiment of the present disclosure.
Figure 16C:
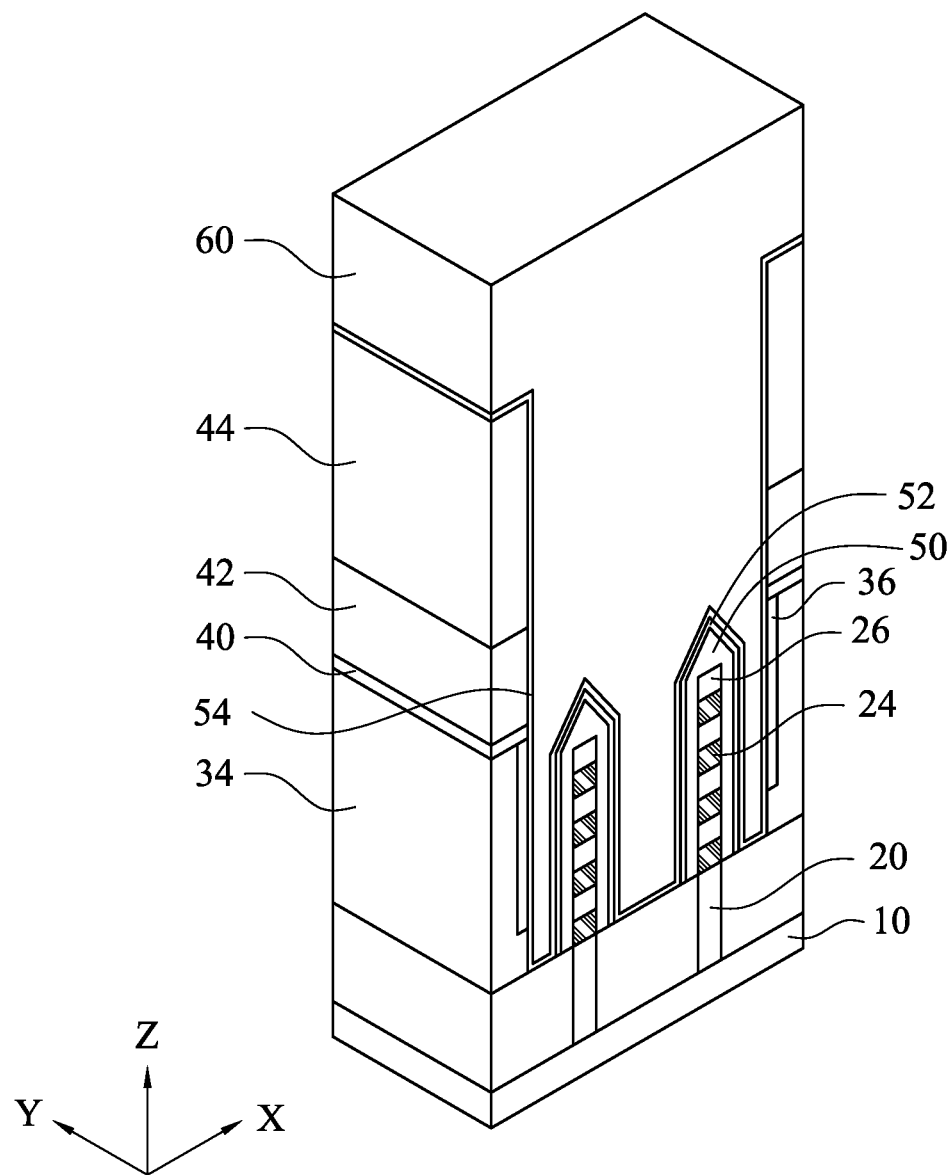
Figure 17B:
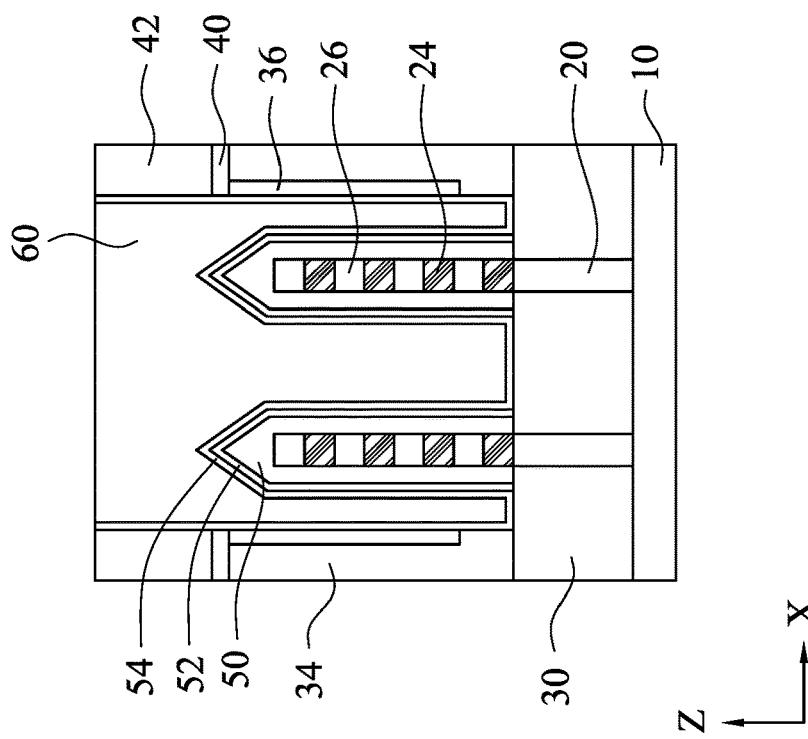
FIG. 17B shows a cross sectional view and FIG. 17C is a cut view of one of the various stages of manufacturing a semiconductor test device according to an embodiment of the present disclosure.
Figure 17A:
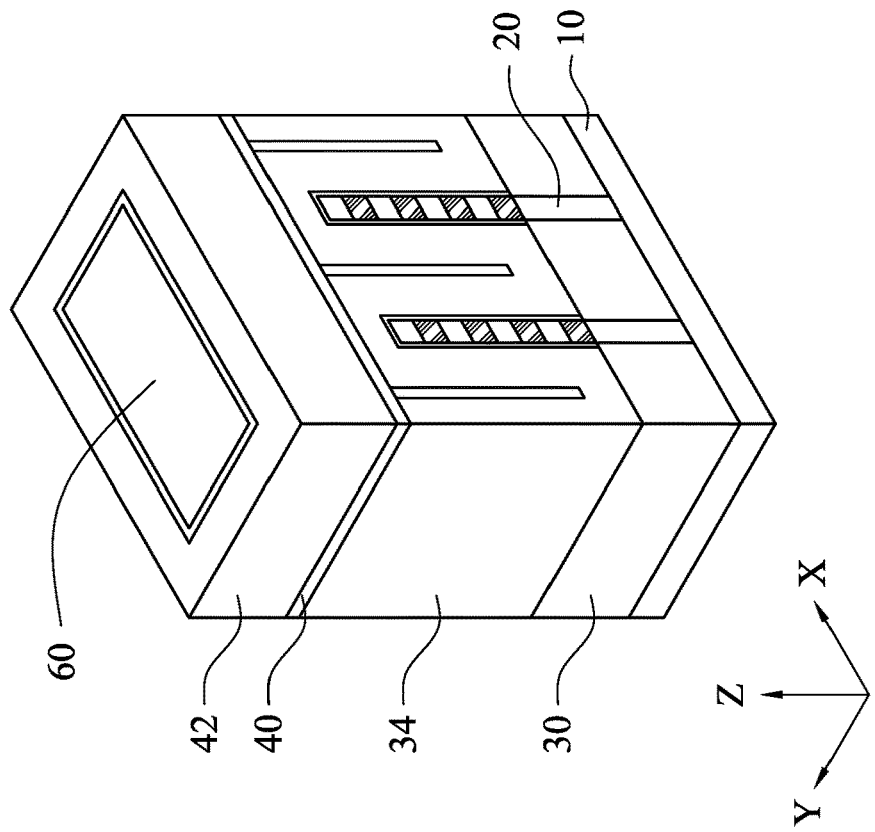
FIG. 17A shows a perspective view.
Figure 17C:
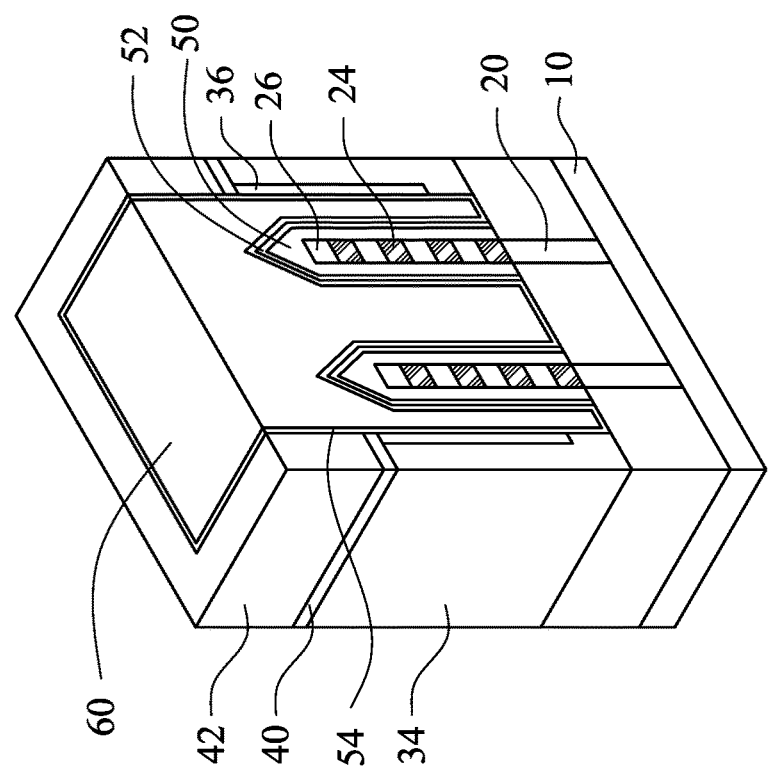

Then, a contact body metal layer 60 is formed over the glue layer 54, as shown in FIGS. 16A-16C, and a planarization operation, such as CMP, is performed to remove excess metal material, as shown in FIGS. 17A-17C. The body metal layer 60 includes one or more of Co, Ni, W, Ti, Ta, Cu and Al, formed by CVD, PVD, ALD and/or electro plating or other suitable methods.

Subsequently, a seventh insulating layer 62 is formed over the body metal layer 60 and the sixth insulating layer 42, and an eighth insulating layer 64 is formed over the seventh insulating layer 62. The seventh and eighth insulating layers are made of different materials and include silicon oxide, silicon nitride, silicon oxynitride (SiON), SiOCN and/or SiCN, or other suitable insulating material. In certain embodiments, the seventh insulating layer 62 is made of silicon nitride, with a thickness of about 2 nm to 10 nm formed by ALD and/or CVD, and the eighth insulating layer 64 is made of silicon oxide formed by ALD and/or CVD.

Figure 18A:
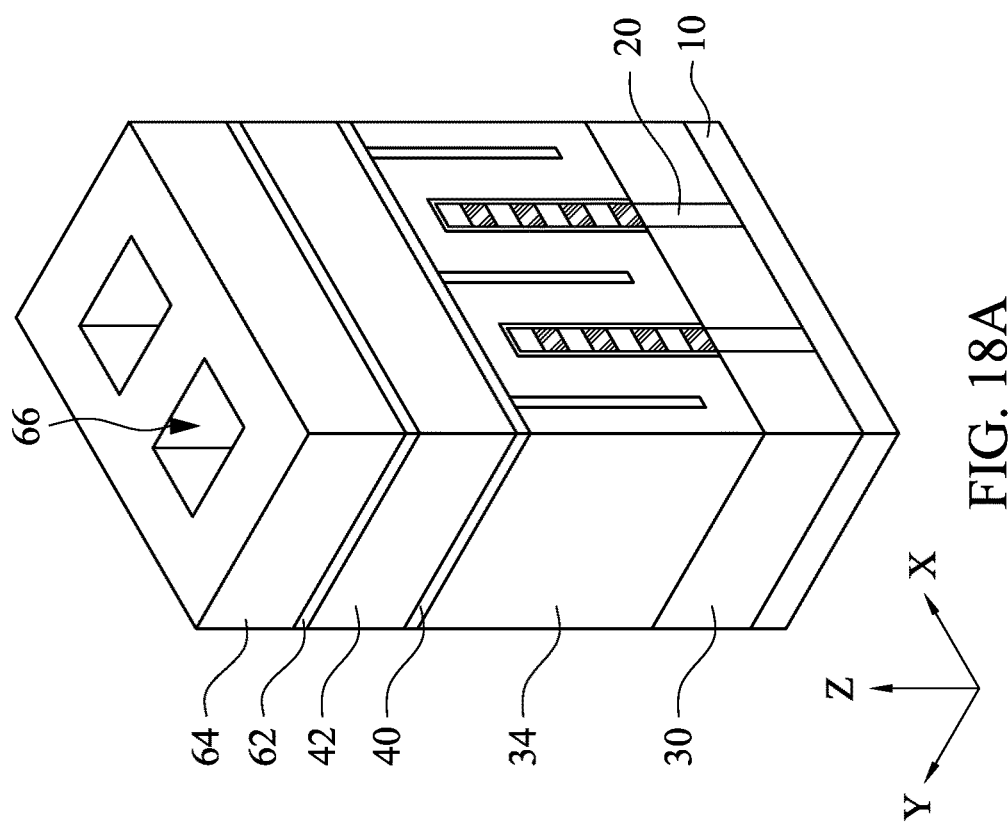
FIG. 18A shows a perspective view.
Figure 18C:
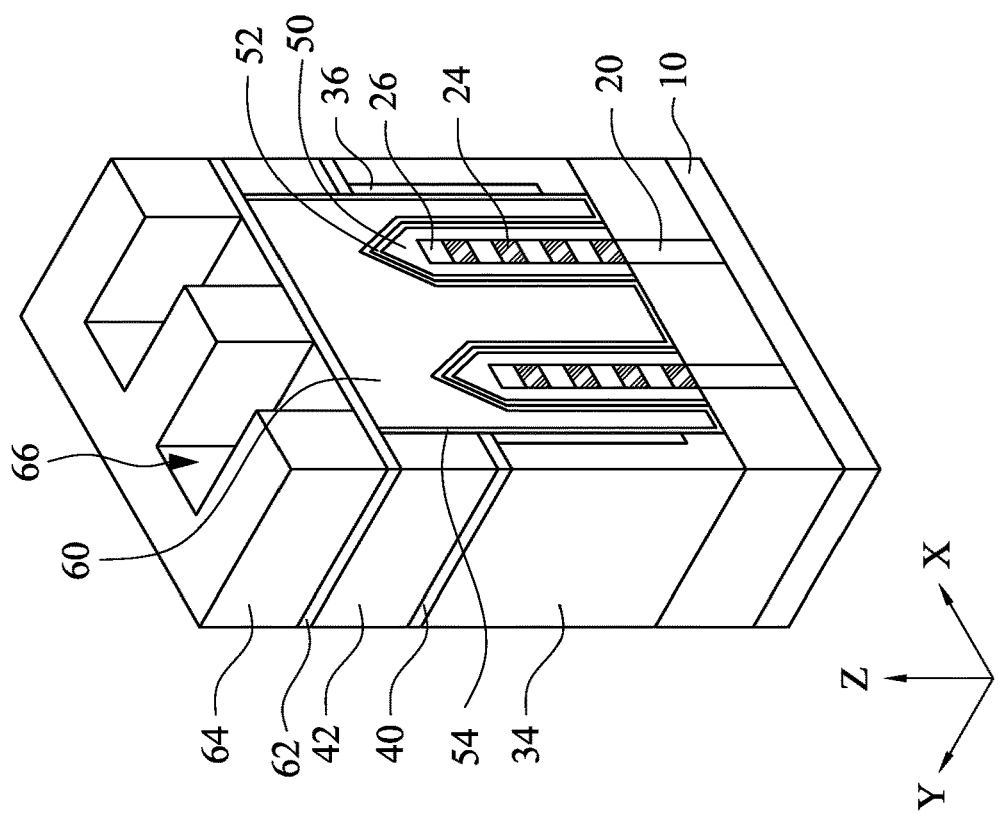
FIG. 18B shows a cross sectional view and FIG. 18C is a cut view of one of the various stages of manufacturing a semiconductor test device according to an embodiment of the present disclosure.
Figure 18B:
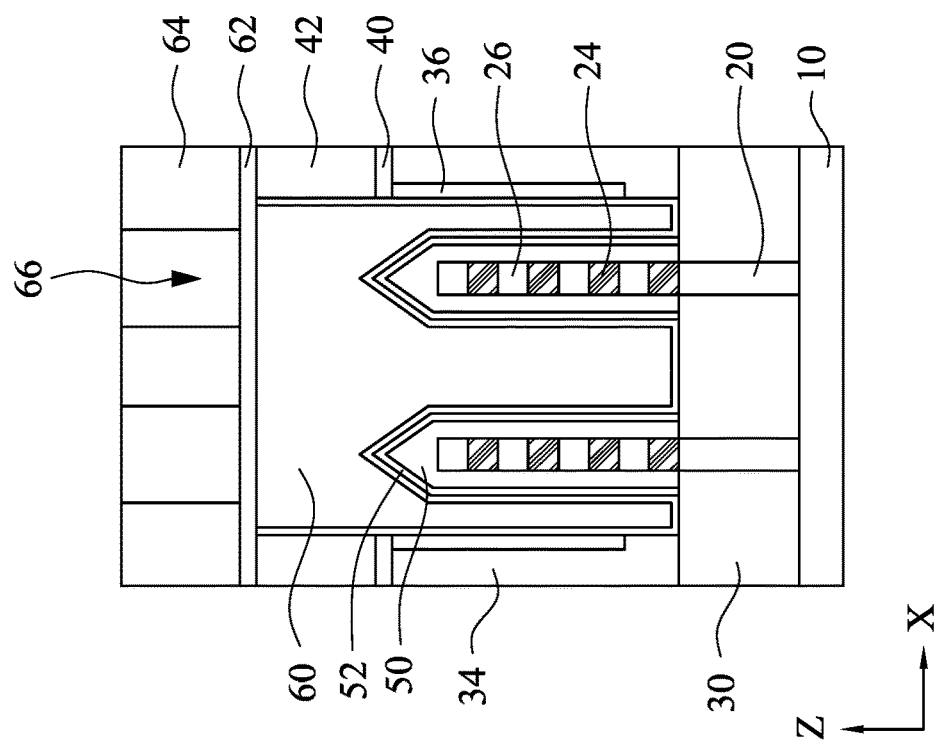

Next, a patterning operation, including one or more lithography operations and dry etching operations, is performed on the seventh and eighth insulating layers to form a contact opening 66 as shown in FIGS. 18A-18C. By the patterning operation, the upper surface of the body metal layer 60 is exposed inside the opening 66.

Figure 19B:
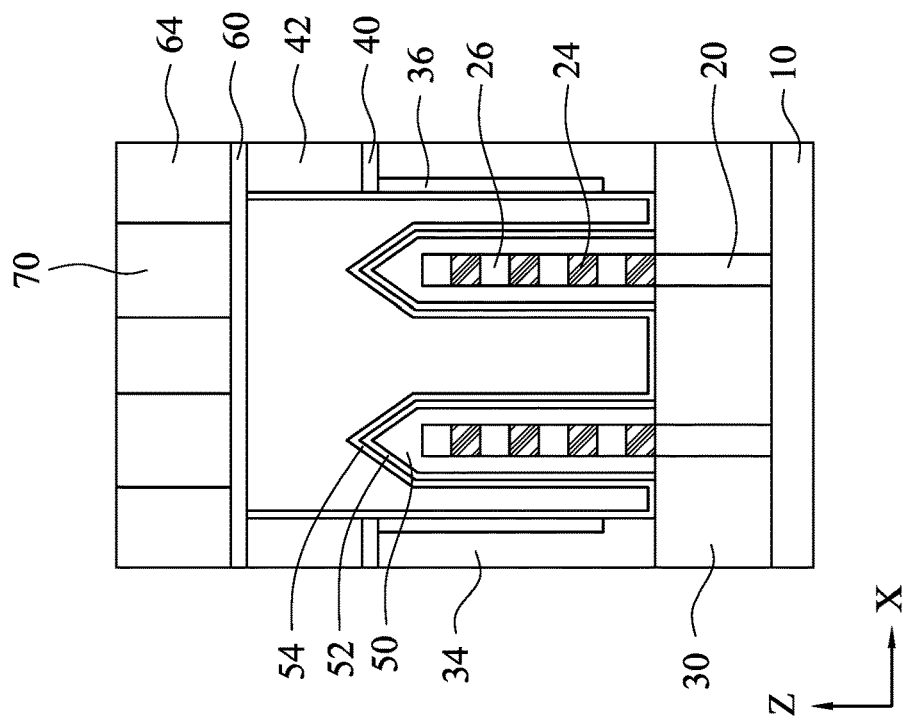
FIG. 19B shows a cross sectional view and FIG. 19C is a cut view of one of the various stages of manufacturing a semiconductor test device according to an embodiment of the present disclosure.
Figure 19A:
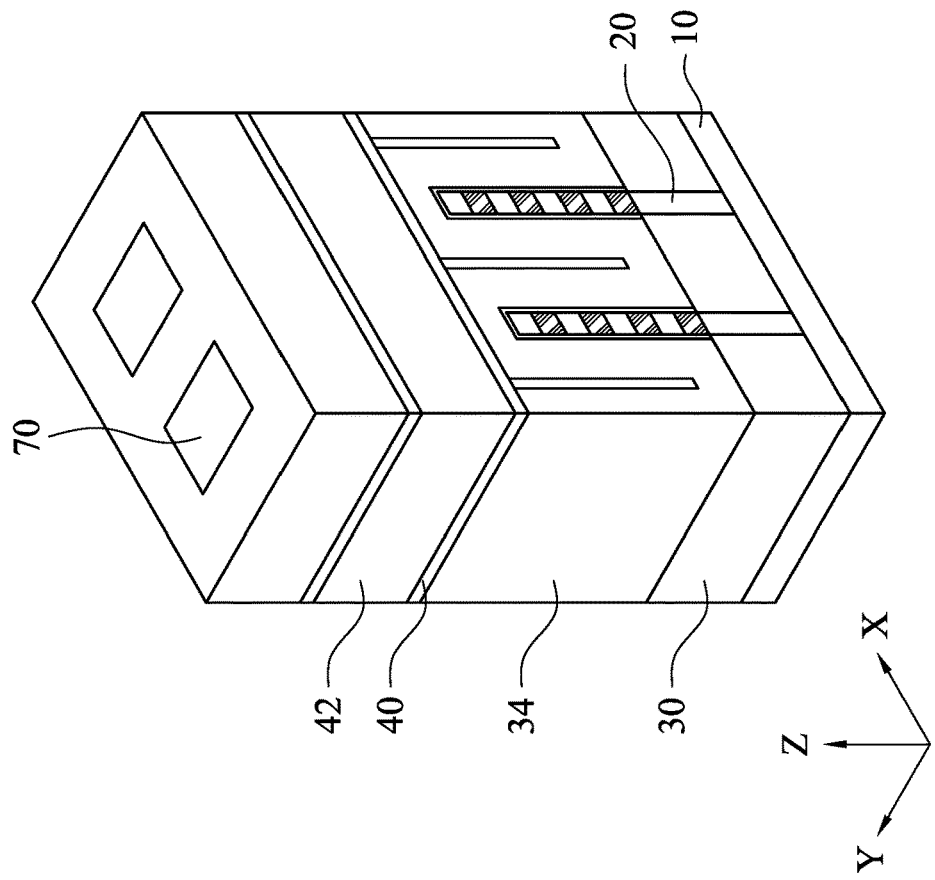
FIG. 19A shows a perspective view.
Figure 19C:
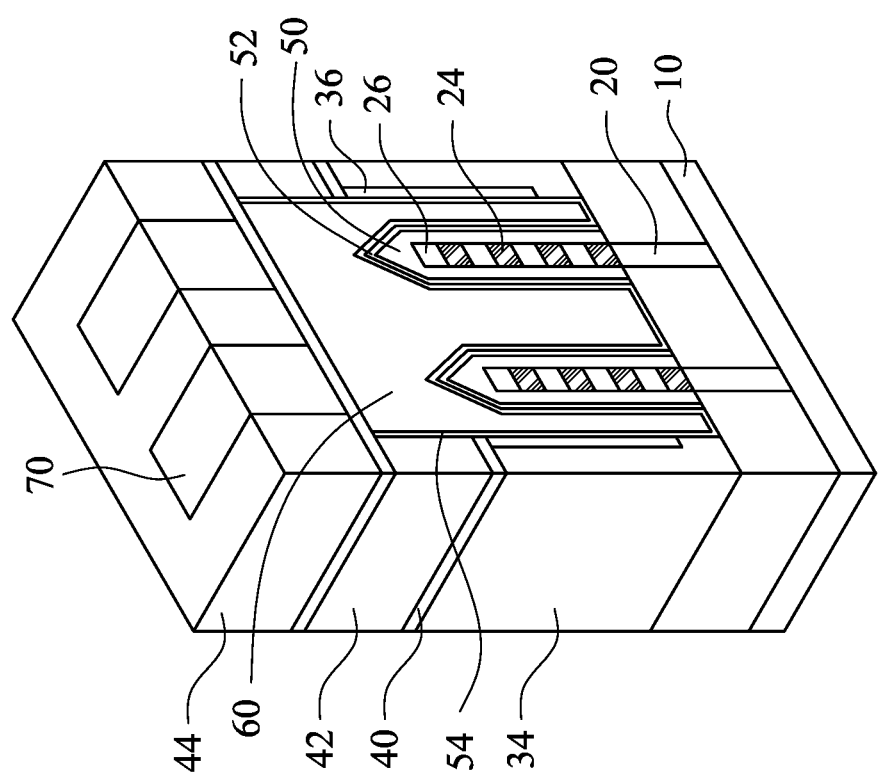

Then, a contact metal layer 70 is formed in the contact opening 66, by forming a metal material layer and performing a planarization operation, such as CMP, as shown in FIGS. 19A-19C. The contact metal layer 70 includes one or more of Co, Ni, W, Ti, Ta, Cu and Al.

Further, a ninth insulating layer 72 is formed over the contact metal layer 70 and the eighth insulating layer 64, and a tenth insulating layer 74 is formed over the ninth insulating layer 72. The ninth and tenth insulating layers are made of different materials and include silicon oxide, silicon nitride, silicon oxynitride (SiON), SiOCN and/or SiCN, or other suitable insulating material. In certain embodiments, the ninth insulating layer 72 is made of silicon nitride, with a thickness of about 2 nm to 10 nm formed by ALD and/or CVD, or other suitable methods, and the tenth insulating layer 74 is made of silicon oxide formed by ALD and/or CVD, or other suitable methods.

Figure 20A:
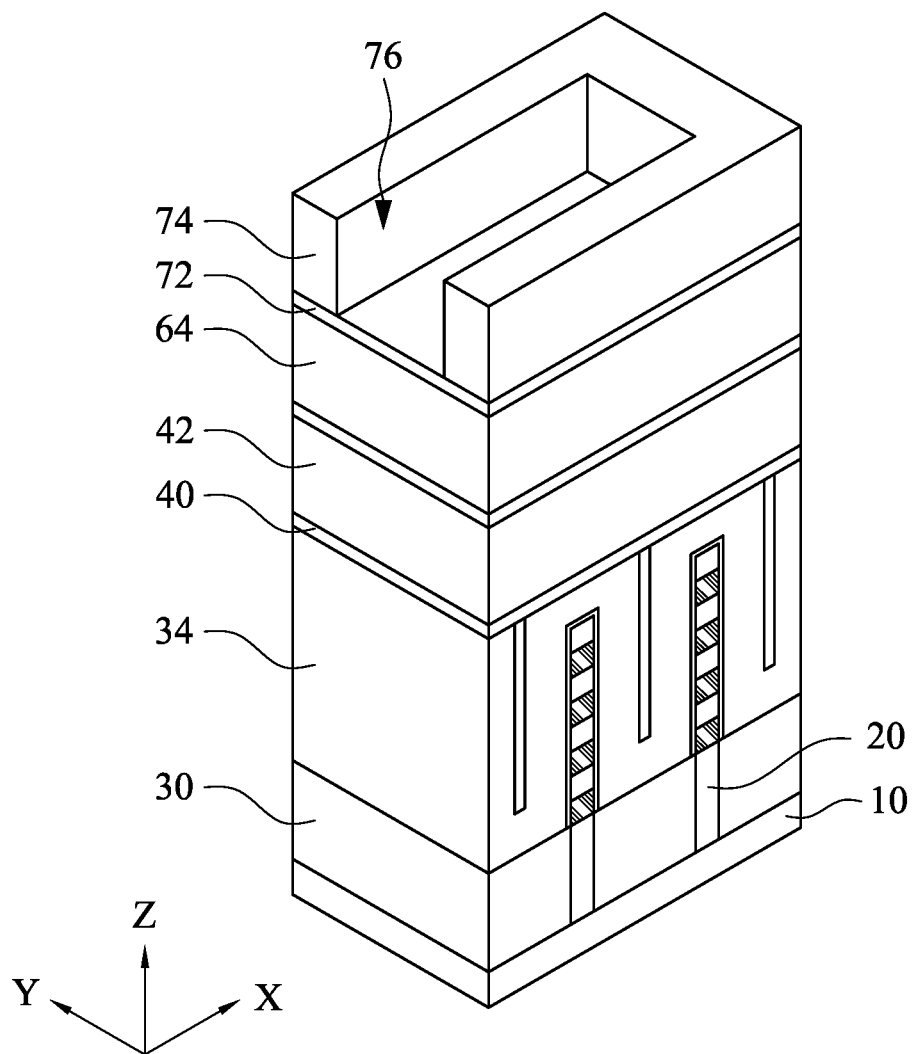
FIG. 20A shows a perspective view.
Figure 20B:
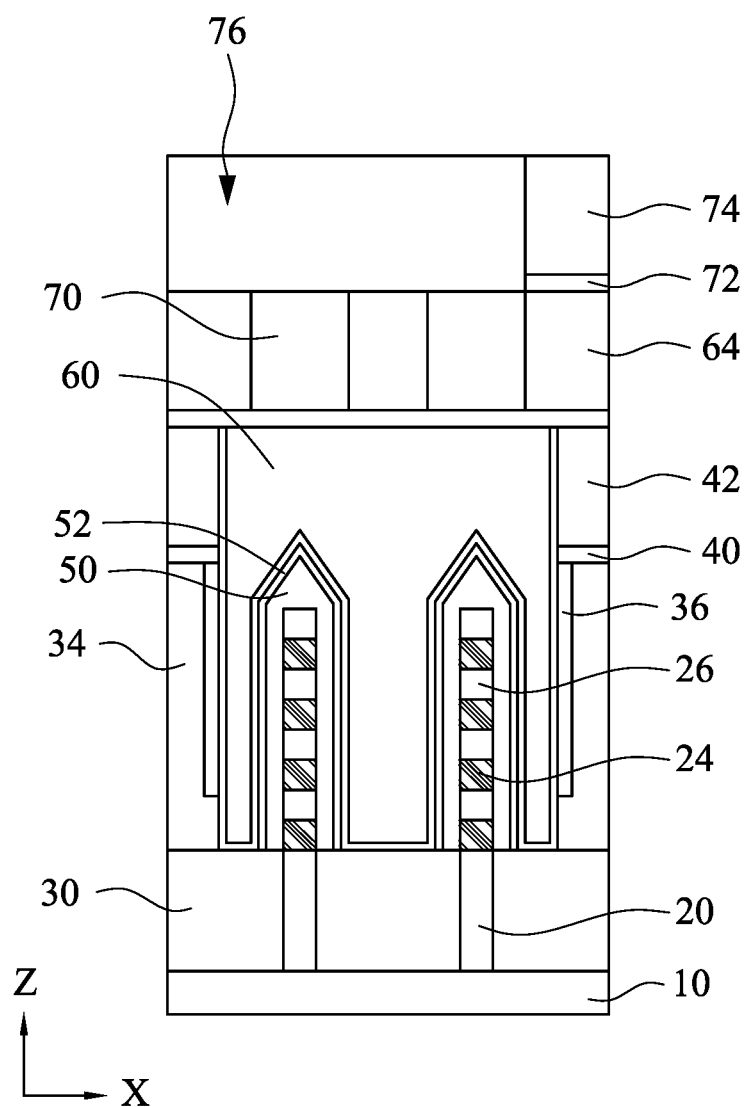
FIG. 20B shows a cross sectional view and FIG. 20C is a cut view of one of the various stages of manufacturing a semiconductor test device according to an embodiment of the present disclosure.
Figure 20C:
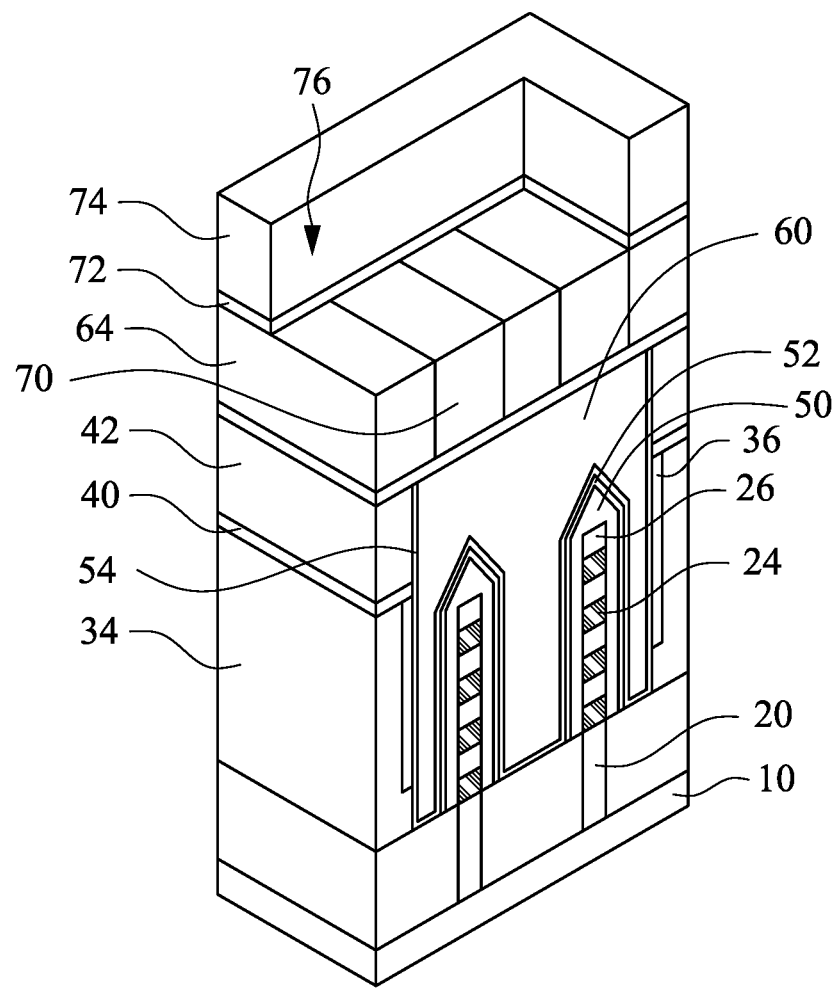

Next, a patterning operation, including one or more lithography operations and dry etching operations, is performed on the tenth and ninth insulating layers to form a wiring opening 76 as shown in FIGS. 20A-20C. By the patterning operation, the upper surface of the contact metal layer 70 is exposed inside the opening 76.

Figure 21A:
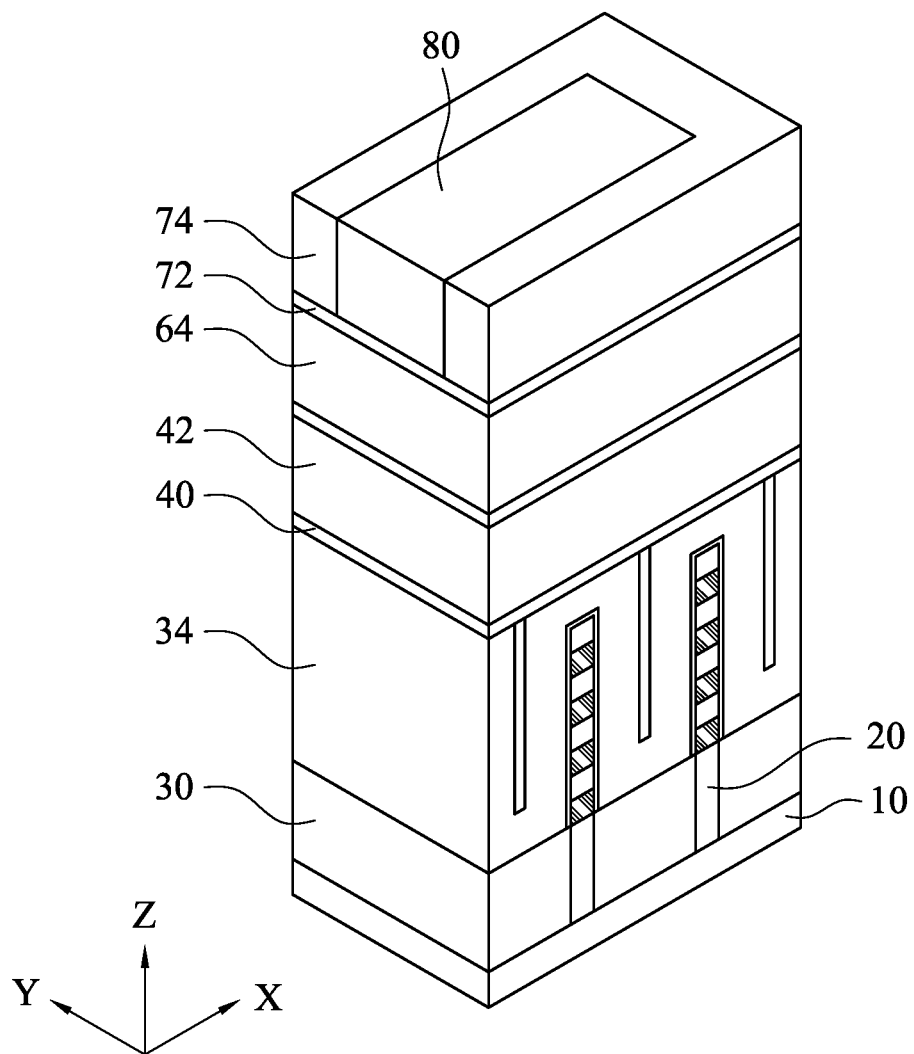
FIG. 21A shows a perspective view.
Figure 21B:
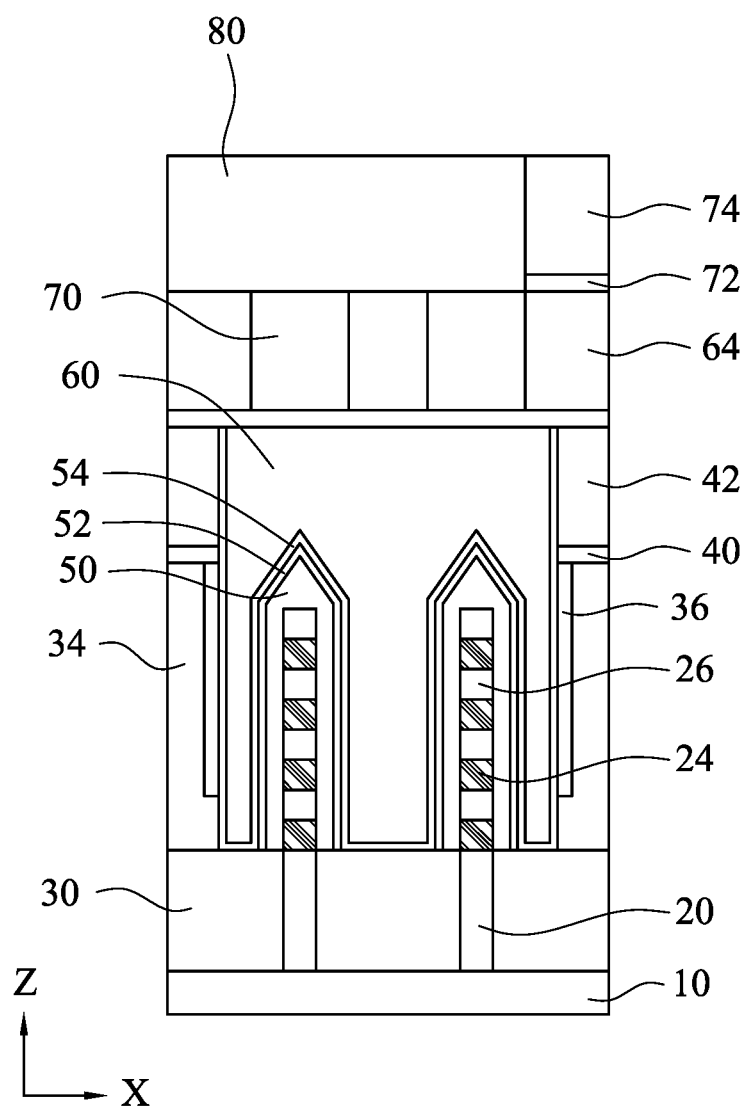
FIG. 21B shows a cross sectional view and FIG. 21C is a cut view of one of the various stages of manufacturing a semiconductor test device according to an embodiment of the present disclosure.
Figure 21C:
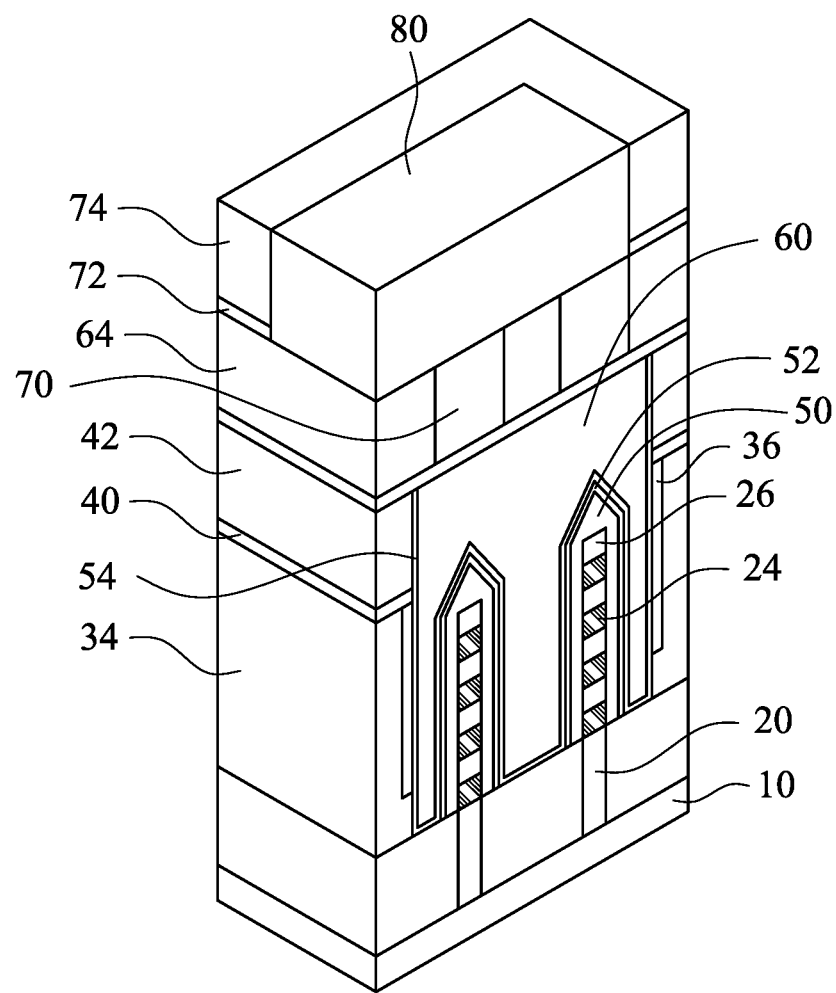

Then, a wiring metal layer 80 is formed in the wiring opening 76, by forming a metal material layer and performing a planarization operation, such as CMP, as shown in FIGS. 21A-21C. The wiring metal layer 80 includes one or more of Co, Ni, W, Ti, Ta, Cu and Al, formed by CVD, PVD, ALD and/or electro plating or other suitable methods.

In the foregoing manufacturing operations, the glue layer 54 and the body metal layer 60 correspond to the glue layer 174 and the body layer 176 of FIGS. 1A-1D, respectively. The silicide layer 52 corresponds to the alloy layer 172 of FIGS. 1A-1D. The epitaxial layer 50 corresponds to the epitaxial layer 160 of FIGS. 1A-1D. The first and second semiconductor layer 22 and 24 correspond to the first semiconductor layers 123 and second semiconductor layer 124 of FIGS. 1A and 1B, respectively. The fin structures (lower portion) 20 correspond to the fin structures 120 of FIGS. 1A-1D. The isolation insulating layer 30 corresponds to the isolation insulating layer 130 of FIGS. 1A-1D.

It is understood that the semiconductor test structures undergoes further CMOS processes to form various features, such as passivation layers, etc.

The various embodiments or examples described herein offer several advantages over the existing art. For example, in the present disclosure, since the upper portions of the fin structures are fully wrapped around the contact metal materials, a lower resistivity can be achieved.

It will be understood that not all advantages have been necessarily discussed herein, no particular advantage is required for all embodiments or examples, and other embodiments or examples may offer different advantages.

In accordance with an aspect of the present disclosure, a semiconductor test device for measuring a contact resistance includes: first fin structures, upper portions of the first fin structures protruding from an isolation insulating layer; epitaxial layers formed on the upper portions of the first fin structures, respectively; first conductive layers formed on the epitaxial layers, respectively; a first contact layer disposed on the first conductive layers at a first point; a second contact layer disposed on the first conductive layers at a second point apart from the first point; a first pad coupled to the first contact layer via a first wiring; and a second pad coupled to the second contact layer via a second wiring. The semiconductor test device is configured to measure the contact resistance between the first contact layer and the first fin structures by applying a current between the first pad and the second pad. In one or more of the foregoing and following embodiments, the semiconductor test device further includes: second fin structures disposed adjacent to the first fin structures; a third contact layer disposed on the first conductive layers of the second fin structure at a third point; and a third pad coupled to the third contact layer via a third wiring. The upper portions of the second fin structures protrude from the isolation insulating layer, the epitaxial layers are formed on the upper portions of the second fin structures, and the first conductive layers are formed on the epitaxial layers, respectively. The third pad is electrically connected to the first fin structure at the first point via a substrate. In one or more of the foregoing and following embodiments, the first conductive layers are silicide layers. In one or more of the foregoing and following embodiments, the first conductive layers fully wrap around the epitaxial layers, respectively. In one or more of the foregoing and following embodiments, the first and second contact layers are in contact with the isolation insulating layer. In one or more of the foregoing and following embodiments, each of the first conductive layers includes two or more conductive material layers. In one or more of the foregoing and following embodiments, a total number of the first fin structures is at least 10. In one or more of the foregoing and following embodiments, upper portions of the first fin structures include multiple layers of different semiconductor materials.

In accordance with another aspect of the present disclosure, a method of measuring a contact resistance using a semiconductor test device is provided. The semiconductor test device includes: first fin structures, upper portions of the first fin structures protruding from an isolation insulating layer; epitaxial layers formed on the upper portions of the first fin structures, respectively; first conductive layers formed on the epitaxial layers, respectively; a first contact layer disposed on the first conductive layers at a first point; a second contact layer disposed on the first conductive layers at a second point apart from the first point; a first pad coupled to the first contact layer via a first wiring; and a second pad coupled to the second contact layer via a second wiring. In the method, a current is applied between the first pad and the second pad so that the current flows through the first fin structures. A voltage between the first pad and bottoms of the first fin structures at the first point is measured. The contact resistance between the first contact layer and the first fin structures is calculated. In one or more of the foregoing and following embodiments, the semiconductor test device further includes: second fin structures disposed adjacent to the first fin structures, upper portions of the second fin structures protruding from the isolation insulating layer, a third contact layer disposed on the first conductive layers of the second fin structure at a third point; and a third pad coupled to the third contact layer via a third wiring. The epitaxial layers are formed on the upper portions of the second fin structures and the first conductive layers are formed on the epitaxial layers, respectively. The third pad is electrically connected to the first fin structure at the first point via a substrate. No current flows between the first pad and the third pad. The voltage is measured between the first pad and the third pad. In one or more of the foregoing and following embodiments, the first conductive layers are silicide layers. In one or more of the foregoing and following embodiments, the first conductive layers fully cover a top and sides of the epitaxial layers, respectively. In one or more of the foregoing and following embodiments, the first conductive layers are in contact with the isolation insulating layer. In one or more of the foregoing and following embodiments, a total number of the first fin structures is at least 10.

In accordance with another aspect of the present disclosure, in a method of manufacturing a semiconductor test device, first fin structures and second fin structures disposed adjacent to the first fin structures are formed. Upper portions of the first and second fin structures protrude from an isolation insulating layer disposed over a substrate. Epitaxial layers are formed to wrap the upper portions of the first and second fin structures. Silicide layers are formed over the epitaxial layers. A first contact layer contacting the silicide layer is formed over a first point of the first fin structures. A second contact layer contacting the silicide layer is formed over a second point of the first fin structures. A third contact layer contacting the silicide layer is formed at a third point of the second fin structures. A first pad coupled to the first contact layer via a first wiring, a second pad coupled to the second contact layer via a second wiring, and a third pad coupled to the third contact layer via a third wiring are formed. In one or more of the foregoing and following embodiments, the silicide layers fully cover a top and side of the epitaxial layers, respectively. In one or more of the foregoing and following embodiments, before the forming the epitaxial layers, one or more dielectric layers are formed over the first and second fin structures, and in the one or more dielectric layers, a first opening is formed over the first point to expose the upper portions of the first fin structures, a second opening is formed over the second point to expose the upper portions of the first fin structures, and a third opening is formed over the third point to expose the upper portions of the second fin structures. The epitaxial layers are formed on the exposed upper portions of the first and second fin structures in the first to third openings. In one or more of the foregoing and following embodiments, a number of the first fin structures exposed in the first and second openings is at least 10, and a number of the second fin structures exposed in the third opening is at least 10. In one or more of the foregoing and following embodiments, the first to third contact layers are in contact with the isolation insulating layer without any portion of the one or more dielectric layers interposed between the first to third contact layers and the isolation insulating layer. In one or more of the foregoing and following embodiments, the upper portions of the first and second fin structures include multiple layers of different semiconductor materials.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor test device for measuring a contact resistance, comprising:
   first fin structures, upper portions of the first fin structures protruding from an isolation insulating layer;
   epitaxial layers formed on the upper portions of the first fin structures, respectively;
   first conductive layers formed on the epitaxial layers, respectively;
   a first contact layer disposed on the first conductive layers at a first point;
   a second contact layer disposed on the first conductive layers at a second point apart from the first point;
   a first pad coupled to the first contact layer via a first wiring; and
   a second pad coupled to the second contact layer via a second wiring,
   wherein the semiconductor test device is configured to measure the contact resistance between the first contact layer and the first fin structures by applying a current between the first pad and the second pad,
   wherein the first conductive layers fully cover a top and sides of the epitaxial layers, respectively, and are in direct contact with the isolation insulating layer,
   wherein the first fin structures include a left-most fin structure and a right-most fin structure, and
   wherein a dielectric layer disposed on the isolation insulating layer is in direct contact with a top of upper portions of the left-most fin structure and the right-most fin structure.

2. The semiconductor test device of claim 1, further comprising:
   second fin structures disposed adjacent to the first fin structures, upper portions of the second fin structures protruding from the isolation insulating layer, the epitaxial layers being formed on the upper portions of the second fin structures and the first conductive layers being formed on the epitaxial layers, respectively;

a third contact layer disposed on the first conductive layers of the second fin structure at a third point; and
a third pad coupled to the third contact layer via a third wiring, wherein:
the third pad is electrically connected to the first fin structure at the first point via a substrate.

3. The semiconductor test device of claim 2, wherein the first conductive layers are silicide layers.

4. The semiconductor test device of claim 2, wherein the first and second contact layers are in contact with the isolation insulating layer.

5. The semiconductor test device of claim 4, wherein each of the first conductive layers includes two or more conductive material layers.

6. The semiconductor test device of claim 2, wherein a total number of the first fin structures is at least 10.

7. The semiconductor test device of claim 2, wherein the upper portions of the first fin structures include multiple layers of different semiconductor materials.

8. A method of measuring a contact resistance using a semiconductor test device, the method including:
providing first fin structures, upper portions of the first fin structures protruding from an isolation insulating layer;
providing epitaxial layers formed on the upper portions of the first fin structures, respectively;
providing first conductive layers formed on the epitaxial layers, respectively;
providing a first contact layer disposed on the first conductive layers at a first point;
providing a second contact layer disposed on the first conductive layers at a second point apart from the first point, wherein the first conductive layers fully cover a top and sides of the epitaxial layers, respectively, and are in direct contact with the isolation insulating layer;
providing a first pad coupled to the first contact layer via a first wiring;
providing a second pad coupled to the second contact layer via a second wiring;
applying a current between the first pad and the second pad so that the current flows through the first fin structures;
measuring a voltage between the first pad and bottoms of the first fin structures at the first point; and
calculating the contact resistance between the first contact layer and the first fin structures,
wherein the first fin structures include a left-most fin structure and a right-most fin structure, and
wherein a dielectric layer disposed on the isolation insulating layer is in direct contact with a top of upper portions of the left-most fin structure and the right-most fin structure.

9. The method of claim 8, wherein:
the semiconductor test device further includes:
second fin structures disposed adjacent to the first fin structures, upper portions of the second fin structures protruding from the isolation insulating layer, the epitaxial layers being formed on the upper portions of the second fin structures and the first conductive layers being formed on the epitaxial layers, respectively;
a third contact layer disposed on the first conductive layers of the second fin structure at a third point; and
a third pad coupled to the third contact layer via a third wiring,
the third pad is electrically connected to the first fin structure at the first point via a substrate,
no current flows between the first pad and the third pad, and
the voltage is measured between the first pad and the third pad.

10. The method of claim 9, wherein the first conductive layers are silicide layers.

11. The method of claim 9, wherein the first conductive layers fully wrap around exposed portions of epitaxial layers, respectively.

12. The method of claim 11, wherein the first conductive layers are in contact with the isolation insulating layer.

13. The method of claim 9, wherein a total number of the first fin structures is at least 10.

14. The method of claim 9, wherein the first conductive layers fully cover a top and sides of the epitaxial layers, respectively.

15. The method of claim 14, wherein the first and second contact layers are in contact with the isolation insulating layer.

16. The method of claim 15, wherein each of the first conductive layers includes two or more conductive material layers.

17. The method of claim 9, wherein the upper portions of the first fin structures include multiple layers of different semiconductor materials.

18. A semiconductor test device for measuring a contact resistance, comprising:
first fin structures, upper portions of the first fin structures protruding from an isolation insulating layer;
epitaxial layers formed on the upper portions of the first fin structures, respectively;
first conductive layers formed on the epitaxial layers, respectively;
a first contact layer disposed on the first conductive layers at a first point;
a first pad coupled to the first contact layer via a first wiring;
second fin structures disposed adjacent to the first fin structures, upper portions of the second fin structures protruding from the isolation insulating layer, the epitaxial layers being formed on the upper portions of the second fin structures and the first conductive layers being formed on the epitaxial layers, respectively;
a second contact layer disposed on the first conductive layers of the second fin structure at a second point; and
a second pad coupled to the second contact layer via a second wiring,
wherein a third pad is electrically connected to the first fin structure at the first point via a substrate,
wherein the first conductive layers fully cover a top and sides of the epitaxial layers, respectively, and are in direct contact with the isolation insulating layer,
wherein the first fin structures include a left-most fin structure and a right-most fin structure, and
wherein a dielectric layer disposed on the isolation insulating layer is in direct contact with a top of upper portions of the left-most fin structure and the right-most fin structure.

19. The semiconductor test device of claim 18, wherein the first conductive layers are silicide layers.

* * * * *